(12) United States Patent
Adams, Jr. et al.

(10) Patent No.: US 8,125,546 B2
(45) Date of Patent: Feb. 28, 2012

(54) COLOR FILTER ARRAY PATTERN HAVING FOUR-CHANNELS

(75) Inventors: James E. Adams, Jr., Rochester, NY (US); Mrityunjay Kumar, Rochester, NY (US); Bruce H. Pillman, Rochester, NY (US); James A. Hamilton, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 316 days.

(21) Appl. No.: 12/478,810

(22) Filed: Jun. 5, 2009

(65) Prior Publication Data

US 2010/0309350 A1 Dec. 9, 2010

(51) Int. Cl.
*H04N 3/14* (2006.01)
(52) U.S. Cl. ........................................... 348/273
(58) Field of Classification Search .................... 348/273
See application file for complete search history.

(56) References Cited

U.S. PATENT DOCUMENTS

| | | | |
|---|---|---|---|
| 3,971,065 A | 7/1976 | Bayer | |
| 4,437,112 A | 3/1984 | Tanaka et al. | |
| 4,896,207 A * | 1/1990 | Parulski | 348/242 |
| 5,227,313 A | 7/1993 | Gluck | |
| 5,244,817 A | 9/1993 | Hawkins et al. | |
| 5,323,233 A | 6/1994 | Yamagami et al. | |
| 5,506,619 A | 4/1996 | Adams, Jr. et al. | |
| 5,914,749 A | 6/1999 | Bawolek et al. | |
| 5,969,368 A | 10/1999 | Thompson et al. | |
| 6,011,875 A | 1/2000 | Laben et al. | |
| 6,097,835 A | 8/2000 | Lindgren | |
| 6,168,965 B1 | 1/2001 | Malinovich et al. | |
| 6,429,036 B1 | 8/2002 | Nixon et al. | |
| 6,441,848 B1 | 8/2002 | Tull | |
| 7,012,643 B2 | 3/2006 | Frame | |
| 7,239,342 B2 | 7/2007 | Kingetsu et al. | |
| 7,298,922 B1 | 11/2007 | Lindgren et al. | |
| 7,315,014 B2 | 1/2008 | Lee et al. | |
| 7,340,099 B2 | 3/2008 | Zhang | |

(Continued)

FOREIGN PATENT DOCUMENTS

EP 1206119 5/2002

(Continued)

OTHER PUBLICATIONS

Debethune, Stanisla, et al., "Adaptive Intensity Matching Filters: A New Tool for Multi-resoultion Data Fusion", [Online], Oct. 2, 1997 (Oct. 2, 1197), XP-002589570, Agard Conference Proceedings 595, Retrieved from the Internet: URL: http:/orbi.ulg.ac.be/handle/2268/4739, 1-13.

(Continued)

*Primary Examiner* — James Hannett
(74) *Attorney, Agent, or Firm* — Blakely Sokoloff Taylor & Zafman LLP

(57) ABSTRACT

An image sensor for capturing a color image comprising a two dimensional array of light-sensitive pixels including panchromatic pixels and color pixels having at least three different color responses, the pixels being arranged in a rectangular minimal repeating unit having at least eight pixels and having at least two rows and two columns, wherein for a first color response, the color pixels having the first color response alternate with panchromatic pixels in at least two directions, and for each of the other color responses there is at least one row, column or diagonal of the repeating pattern that only has color pixels of the given color response and panchromatic pixels.

8 Claims, 22 Drawing Sheets

U.S. PATENT DOCUMENTS

| | | |
|---|---|---|
| 7,615,808 B2 | 11/2009 | Pain et al. |
| 7,706,022 B2 * | 4/2010 | Okuyama ............... 358/2.1 |
| 7,859,033 B2 | 12/2010 | Brady |
| 7,893,976 B2 * | 2/2011 | Compton et al. ........... 348/277 |
| 7,915,067 B2 | 3/2011 | Brady et al. |
| 2003/0210332 A1 | 11/2003 | Frame |
| 2004/0007722 A1 | 1/2004 | Narui et al. |
| 2004/0207823 A1 | 10/2004 | Alasaarela et al. |
| 2004/0227456 A1 | 11/2004 | Matsui |
| 2005/0104148 A1 | 5/2005 | Yamamoto et al. |
| 2005/0128586 A1 | 6/2005 | Sedlmayr |
| 2006/0017829 A1 | 1/2006 | Gallagher |
| 2006/0017837 A1 | 1/2006 | Sorek et al. |
| 2006/0068586 A1 | 3/2006 | Pain |
| 2006/0119710 A1 | 6/2006 | Ben-Ezra et al. |
| 2006/0139245 A1 | 6/2006 | Sugiyama |
| 2006/0186560 A1 | 8/2006 | Swain et al. |
| 2006/0187308 A1 | 8/2006 | Lim et al. |
| 2007/0024879 A1 * | 2/2007 | Hamilton et al. ............ 358/1.9 |
| 2007/0024931 A1 * | 2/2007 | Compton et al. ............ 358/512 |
| 2007/0024934 A1 | 2/2007 | Adams, Jr. et al. |
| 2007/0046807 A1 * | 3/2007 | Hamilton et al. ............ 348/362 |
| 2007/0076269 A1 | 4/2007 | Kido et al. |
| 2007/0127040 A1 | 6/2007 | Davidovici |
| 2007/0159542 A1 | 7/2007 | Luo |
| 2007/0177236 A1 * | 8/2007 | Kijima et al. .............. 358/514 |
| 2007/0194397 A1 | 8/2007 | Adkisson et al. |
| 2007/0223831 A1 | 9/2007 | Mei et al. |
| 2007/0235829 A1 | 10/2007 | Levine et al. |
| 2008/0012969 A1 | 1/2008 | Kasai et al. |
| 2008/0038864 A1 | 2/2008 | Yoo et al. |
| 2008/0084486 A1 | 4/2008 | Enge et al. |
| 2008/0123997 A1 | 5/2008 | Adams, Jr. et al. |
| 2008/0128598 A1 | 6/2008 | Kanai et al. |
| 2008/0130991 A1 | 6/2008 | O'Brien et al. |
| 2008/0165815 A1 | 7/2008 | Kamijima |
| 2008/0211943 A1 | 9/2008 | Egawa et al. |
| 2008/0218597 A1 | 9/2008 | Cho |
| 2008/0240602 A1 | 10/2008 | Adams, Jr. et al. |
| 2009/0016390 A1 | 1/2009 | Sumiyama et al. |
| 2009/0021588 A1 | 1/2009 | Border et al. |
| 2009/0021612 A1 | 1/2009 | Hamilton, Jr. et al. |
| 2009/0096991 A1 | 4/2009 | Chien et al. |
| 2009/0141242 A1 | 6/2009 | Silverstein et al. |
| 2009/0167893 A1 | 7/2009 | Susanu |
| 2009/0179995 A1 | 7/2009 | Fukumoto et al. |
| 2009/0195681 A1 | 8/2009 | Compton et al. |
| 2009/0206377 A1 | 8/2009 | Swain et al. |
| 2009/0268055 A1 | 10/2009 | Hamilton, Jr. et al. |
| 2009/0290043 A1 | 11/2009 | Liu et al. |
| 2010/0006909 A1 | 1/2010 | Brady |
| 2010/0006963 A1 | 1/2010 | Brady et al. |
| 2010/0006970 A1 | 1/2010 | Brady et al. |
| 2010/0026839 A1 | 2/2010 | Border et al. |
| 2010/0091169 A1 | 4/2010 | Border et al. |
| 2010/0104209 A1 | 4/2010 | Deever et al. |
| 2010/0119148 A1 | 5/2010 | Adams, Jr. et al. |
| 2010/0149396 A1 | 6/2010 | Summa et al. |
| 2010/0232692 A1 | 9/2010 | Kumar et al. |
| 2010/0245636 A1 | 9/2010 | Kumar |
| 2010/0253833 A1 | 10/2010 | Deever et al. |
| 2010/0265370 A1 | 10/2010 | Kumar et al. |
| 2010/0302418 A1 | 12/2010 | Adams, Jr. et al. |
| 2010/0302423 A1 | 12/2010 | Adams, Jr. et al. |
| 2010/0309340 A1 | 12/2010 | Border et al. |
| 2010/0309347 A1 | 12/2010 | Adams, Jr. |
| 2010/0309350 A1 | 12/2010 | Adams, Jr. et al. |
| 2011/0042770 A1 | 2/2011 | Brady |
| 2011/0059572 A1 | 3/2011 | Brady |
| 2011/0211109 A1 | 9/2011 | Compton et al. |

FOREIGN PATENT DOCUMENTS

| | | |
|---|---|---|
| EP | 1322123 | 6/2003 |
| EP | 1612863 | 1/2006 |
| JP | 2005/099160 | 4/2005 |
| JP | 2005/268738 | 9/2005 |
| JP | 2007/271667 | 10/2007 |
| WO | WO-2007/030226 | 3/2007 |
| WO | 2007/089426 | 8/2007 |
| WO | WO-2007/089426 | 8/2007 |
| WO | WO 2007/089426 A1 | 8/2007 |
| WO | WO-2007/139675 | 12/2007 |
| WO | WO-2008/044673 | 4/2008 |
| WO | WO 2008/066703 A2 | 6/2008 |
| WO | WO-2008/069920 | 6/2008 |
| WO | WO-2008066703 | 6/2008 |
| WO | WO-2008/106282 | 9/2008 |
| WO | WO-2008/118525 | 10/2008 |

OTHER PUBLICATIONS

Joy, T., et al., "Development of a Production-Ready, Back-Illuminated CMOS Image Sensor with Small Pixels", Electron Devices Meeting, Dec. 2007. IEDM 2007. IEEE International, 1007-1010.

Marius, Tico, et al., "Image Stabilization Based on Fusing the Visual Information in Differently Expose Images", *Proceedings 2007 IEEE International conference on Image Processing,* ICIP 2007 (Feb. 1, 2007), XP002609057, IEEE Piscataway, NJ USA, ISBN: 978-1-4244-1436-9, Sections 1-2, p. 3, 117-120.

Marius, Tico, et al., "Motion Blur Indentification Based on Directly Exposed Images", *2006 International Conference on Image Processing,* Oct. 11, 1996, XP002609058, IEEE Piscataway, NJ, USA, ISBN: 1-4244-0481-9, Section 2, Abstract, 2021-2024.

Yu-Wing, Tia, et al., "Image/Video Deblurring Using a Hybrid Camera", *Computer Vision and Pattern Recognition, 2008, CVPR 2008. IEEE Conference on, IEEE,* Piscataway, NJ, USA, Jun. 23, 2008, XP031297065, ISBN: 978-1-4244-2242-5, 1-8.

* cited by examiner

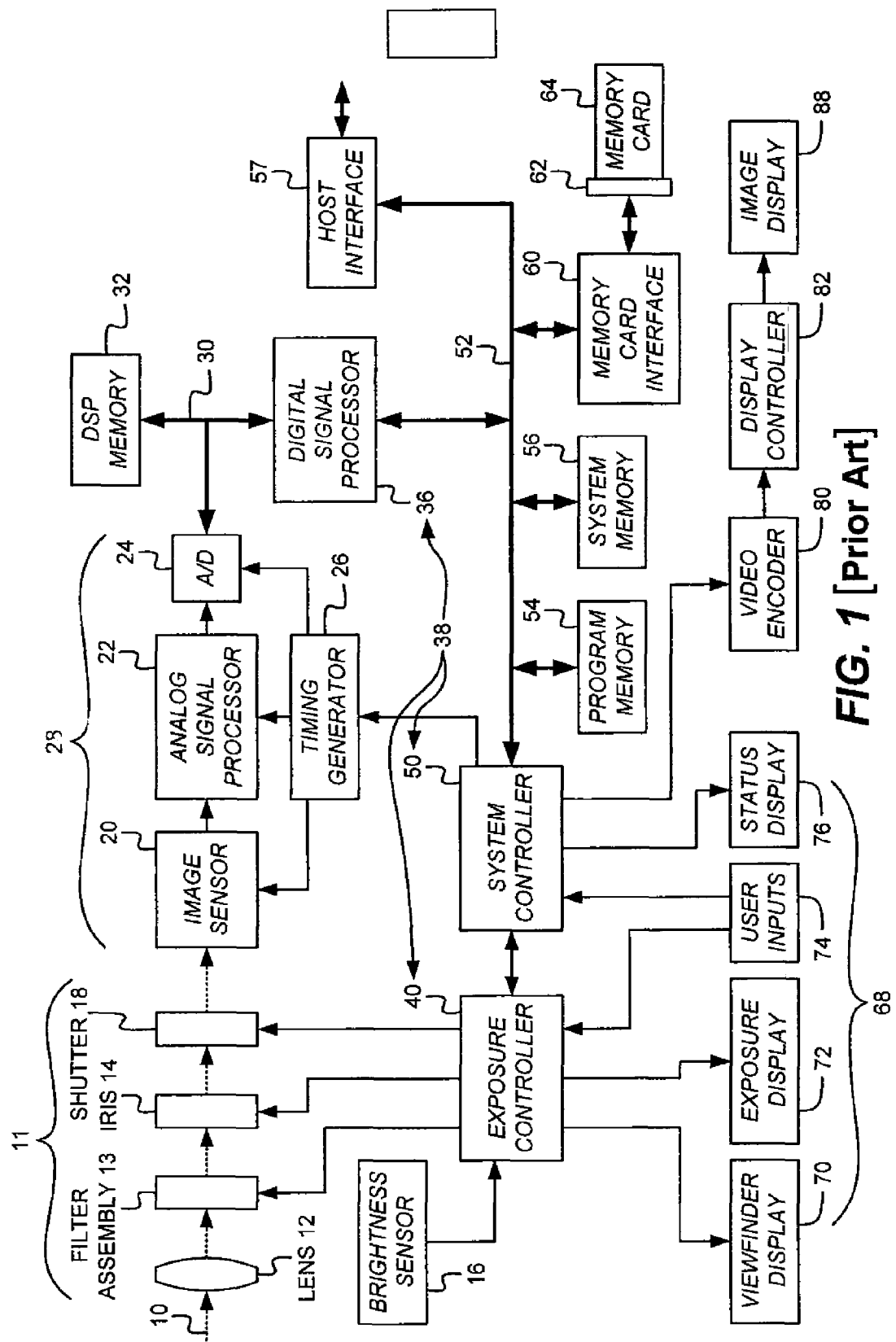
FIG. 1 [Prior Art]

| P | P | P | B |
|---|---|---|---|
| G | P | G | P |
| P | R | P | P |
| G | P | G | P |

FIG. 3

| R | G |
|---|---|
| G | B |

FIG. 2
(PRIOR ART)

| G | P | G | P |
|---|---|---|---|
| P | R | P | B |

FIG. 4B

| G | P |
|---|---|
| P | R |
| G | P |
| P | B |

FIG. 4A

| B | P | R | P |
|---|---|---|---|
| G | P | G | P |
| R | P | B | P |
| G | P | G | P |

FIG. 5B

| P | P | P | P |
|---|---|---|---|
| G | B | G | R |
| P | P | P | P |
| G | R | G | B |

FIG. 5A

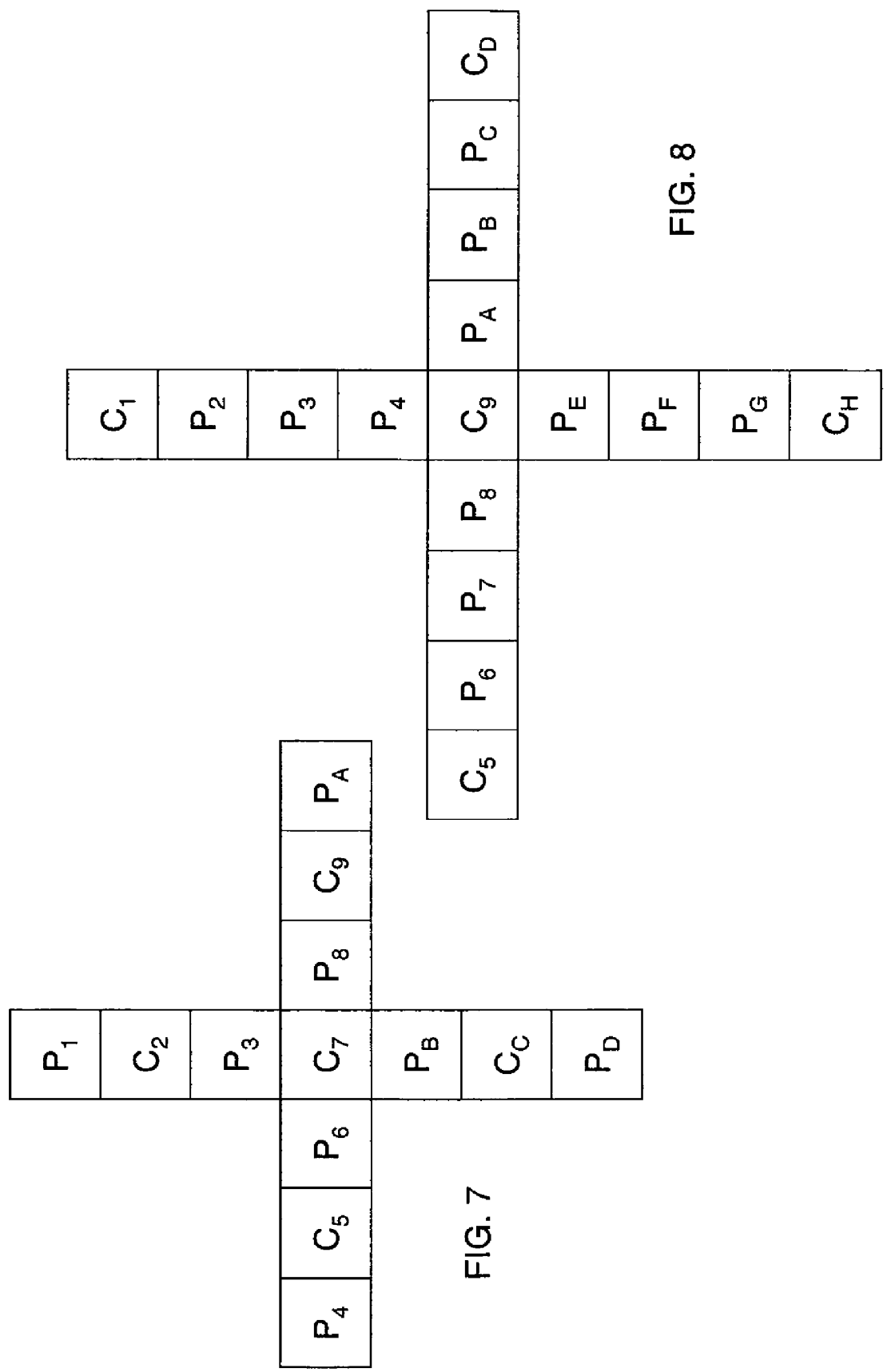

FIG. 9B

|  |  |  | $P_E$ |  |  |  |
|---|---|---|---|---|---|---|
|  |  |  | $C_D$ |  |  |  |
|  | $P_4$ | $G_7$ | $P_C$ | $G_H$ | $P_K$ |  |
| $P_1$ | $D_3$ | $P_6$ | $C_B$ | $P_G$ | $D_J$ | $P_L$ |
|  | $P_2$ | $G_5$ | $P_A$ | $G_F$ | $P_I$ |  |
|  |  |  | $C_9$ |  |  |  |
|  |  |  | $P_8$ |  |  |  |

FIG. 9A

|  |  |  | $P_E$ |  |  |  |
|---|---|---|---|---|---|---|
|  |  | $P_7$ | $D_D$ | $P_J$ |  |  |
|  |  | $G_6$ | $P_C$ | $G_I$ |  |  |
| $P_1$ | $C_2$ | $P_5$ | $C_B$ | $P_H$ | $C_K$ | $P_L$ |
|  |  | $G_4$ | $P_A$ | $G_G$ |  |  |
|  |  | $P_3$ | $D_9$ | $P_F$ |  |  |
|  |  |  | $P_8$ |  |  |  |

|   | $P_D$ |   |
|---|---|---|
| $G_6$ | $D_C$ | $G_I$ |
| $P_5$ | $P_B$ | $P_H$ |

| $D_1$ | $G_4$ | $C_A$ | $G_G$ | $D_J$ |

| $P_3$ | $P_9$ | $P_F$ |
|---|---|---|
| $G_2$ | $D_8$ | $G_E$ |
|   | $P_7$ |   |

FIG. 11B

|   | $G_9$ |   |   |
|---|---|---|---|
| $P_4$ | $P_8$ | $P_C$ |   |

| $G_1$ | $C_3$ | $G_7$ | $D_B$ | $G_D$ |

| $P_2$ | $P_6$ | $P_A$ |
|---|---|---|
|   | $G_5$ |   |

FIG. 11A

| $D_0$ | $P_1$ | $P_2$ | $P_3$ | $D_4$ |
|---|---|---|---|---|
| $P_5$ | $P'_6$ | $P_7$ | $P'_8$ | $P_9$ |
| $P_A$ | $P_B$ | $P'_C$ | $P_D$ | $P_E$ |
| $P_F$ | $P'_G$ | $P_H$ | $P'_I$ | $P_J$ |
| $D_K$ | $P_L$ | $P_M$ | $P_N$ | $D_P$ |

FIG. 14

| $D_1$ | $P_2$ | $D_3$ |
|---|---|---|
| $P_4$ | $P'_5$ | $P_6$ |
| $D_7$ | $P_8$ | $D_9$ |

| $D_0$ | $P_1$ | $D_2$ |
|---|---|---|
| $P_3$ | $P'_4$ | $P_5$ |
| $P'_6$ | $P_7$ | $P'_8$ |
| $P_9$ | $P'_A$ | $P_B$ |
| $D_C$ | $P_D$ | $D_E$ |

FIG. 15A

| $D_0$ | $P_1$ | $P'_2$ | $P_3$ | $D_4$ |
|---|---|---|---|---|
| $P_5$ | $P'_6$ | $P_7$ | $P'_8$ | $P_9$ |
| $D_A$ | $P_B$ | $P'_C$ | $P_D$ | $D_E$ |

$$
\begin{array}{|c|c|c|c|c|}
\hline
 & & D_8 & & \\
\hline
 & P_3 & P'_7 & P_B & \\
\hline
D_0 & P_2 & P'_6 & P_A & D_C \\
\hline
 & P_1 & P'_5 & P_9 & \\
\hline
 & & D_4 & & \\
\hline
\end{array}
$$

FIG. 16B $$
\begin{array}{|c|c|c|c|c|}
\hline
 & & D_8 & & \\
\hline
 & P_3 & P_7 & P_B & \\
\hline
D_0 & P'_2 & P'_6 & P'_A & D_C \\
\hline
 & P_1 & P_5 & P_9 & \\
\hline
 & & D_4 & & \\
\hline
\end{array}
$$

| P | P | P | P | P | P | P | P | P |
|---|---|---|---|---|---|---|---|---|
| P | P | P | P | P | P | P | P | P |
| P | P | P | P | P | P | P | P | P |
| P | P | P | P | B | P | P | P | P |
| P | P | P | P | G | P | P | P | P |
| P | P | P | P | R | P | P | P | P |
| P | P | P | P | P | P | P | P | P |
| P | P | P | P | P | P | P | P | P |
| P | P | P | P | P | P | P | P | P |

FIG. 20B
(PRIOR ART)

|   |   |   |   |   |   |
|---|---|---|---|---|---|
| B | P | B | P | B | P |
| P | G | P | G | P | G |
| R | P | R | P | R | P |
| P | B | P | B | P | B |
| G | P | G | P | G | P |
| P | R | P | R | P | R |

FIG. 20A
(PRIOR ART)

|   |   |   |   |
|---|---|---|---|
| G | P | G | P |
| P | B | P | R |
| G | P | G | P |
| P | R | P | B |

| P | G | P | P |
|---|---|---|---|
| C | P | Y | P |
| P | P | P | G |
| Y | P | C | P |

FIG. 22
(PRIOR ART)

| R | P | G | P |
|---|---|---|---|
| P | R | P | G |
| G | P | B | P |
| P | G | P | B |

FIG. 23B
(PRIOR ART)

| P | R | P | G | P | G |
|---|---|---|---|---|---|
| R | P | R | P | G | P |
| P | R | P | G | P | G |
| G | P | G | P | B | P |
| P | G | P | B | P | B |
| G | P | G | P | B | P |

FIG. 23A
(PRIOR ART)

| P | P | R | P | P | G |
|---|---|---|---|---|---|
| P | P | G | P | P | B |
| P | P | R | P | P | G |
| P | P | G | P | P | B |
| P | P | R | P | P | G |
| P | P | G | P | P | B |

FIG. 24
(PRIOR ART)

| G | P |
|---|---|
| P | P |
| G | P |
| P | B |
| G | P |
| P | P |
| G | P |
| P | R |

FIG. 25 ized U.S. application Ser. No. 12/401,002, filed Mar. 10, 2009 entitled CFA
COLOR FILTER ARRAY PATTERN HAVING FOUR-CHANNELS

CROSS REFERENCE TO RELATED APPLICATIONS

Reference is made to commonly assigned U.S. application Ser. No. 12/401,002, filed Mar. 10, 2009 entitled CFA IMAGE WITH SYNTHETIC PANCHROMATIC IMAGE by Kumar et al., commonly assigned U.S. application Ser. No. 12/412,429, filed Mar. 27, 2009 entitled PRODUCING FULL-COLOR IMAGE USING CFA IMAGE by Kumar et al., commonly assigned U.S. application Ser. No. 12/423,839 filed Apr. 15, 2009 entitled PRODUCING FULL-COLOR IMAGE WITH REDUCED MOTION BLUR by Kumar et al., commonly assigned U.S. application Ser. No. 12/472,563 filed May 27, 2009 entitled FOUR-CHANNEL COLOR FILTER ARRAY PATTERN by Adams et al., and commonly assigned U.S. application Ser. No. 12/473,305 filed May 28, 2009 entitled FOUR-CHANNEL COLOR FILTER ARRAY INTERPOLATION by Adams et al. the disclosures of which is incorporated herein by reference.

FIELD OF THE INVENTION

The present invention relates to producing a full-color image with improved spatial resolution from a color filter array image having color channels and a panchromatic channel.

BACKGROUND OF THE INVENTION

A single-sensor digital camera employs a color filter array (CFA) in order to capture full-color information from a single two dimensional array of light-sensitive pixels. The CFA consists of an array of color filters that filter the light being detected by each pixel. As a result, each pixel receives light from only one color, or in the case of a panchromatic or "clear" filter, from all colors. In order to reproduce a full-color image from the CFA image, three color values must be produced at each pixel location. This is accomplished by interpolating the missing color values from neighboring pixel values.

The best known CFA pattern uses three colors channels as described by Bayer (U.S. Pat. No. 3,971,065) and shown in FIG. 2. The Bayer CFA has three color channels which enables full-color reproduction capability. However, the exact spectral responsivities ("colors") of the three channels represent a compromise. In order to improve color fidelity and broaden the range of colors that can be captured by the CFA (i.e., the color gamut), the spectral responsivities need to be made more selective ("narrowed"). This has the side effect of reducing the overall amount of light that reaches the pixel and, therefore, reduces its sensitivity to light. As a consequence, the pixel value becomes more susceptible to noise from non-imaging sources, e.g., thermal noise. One solution to the noise problem is to make the CFA spectral responsivities less selective ("broader") to increase the overall amount of light that reaches the pixel. However, this comes with the side effect of reducing color fidelity.

A solution to this three-channel CFA limitation is to employ a four-channel CFA composed of three colors with "narrow" spectral sensitivities and one color with a "broad" spectral sensitivity. The "broadest" such channel would be panchromatic or "clear" which would be sensitive to the full spectrum of light. The three "narrowband" color channels would produce an image with higher color fidelity and lower spatial resolution while the fourth "broadband" panchromatic channel would produce an image with lower noise and higher spatial resolution. These high color fidelity, low spatial resolution and low noise, high spatial resolution images would then be merged into a final high color fidelity, low noise, high spatial resolution image.

In order to produce a high spatial resolution panchromatic image while maintaining high color fidelity from the color pixels, the number and arrangement of panchromatic pixels within the CFA and the corresponding interpolation algorithms must be properly chosen. There are a variety of examples in the prior art with one or more liabilities in this regard. Frame (U.S. Pat. No. 7,012,643) teaches a CFA as shown in FIG. 19 that has only a single red (R), green (G), and blue (B) pixel within a 9×9 square of panchromatic (P) pixels. The problem with Frame is that the resulting color spatial resolution is too low to produce all but the lowest frequency color details in the image.

Yamagami et al. (U.S. Pat. No. 5,323,233) describe two CFA patterns as shown in FIGS. 20A and 20B that have equal amounts of panchromatic and color pixels, avoiding the liability of Frame. Yamagami et al. go on to teach using simple bilinear interpolation as the means for interpolating the missing panchromatic values. The use of solely linear interpolation methods (such as bilinear interpolation) strongly limits the spatial resolution of the interpolated image. Nonlinear methods, such as that described in Adams et al. (U.S. Pat. No. 5,506,619), produce higher spatial resolution interpolated images, provided the CFA pattern permits their use. FIG. 21A illustrates the pattern used in Adams et al. Green (G) pixels, which provide the high spatial frequency resolution in the three channel system shown in FIG. 2, alternate with color (C) pixels in both the horizontal and vertical directions about a central color pixel. It is important to note that these color pixels are all the same color, e.g., red pixels. FIG. 21B shows a similar pattern that uses panchromatic (P) pixels in place of green pixels. It should be noted at this point that for a four-channel system it is not possible to arrange all four channels (R, G, B, and P) in such a way that the pattern shown in FIG. 21B occurs at all color (R, G, B) pixel locations across the sensor. Therefore, any possible arrangement will be some compromise in this manner. With regard to Yamagami et al. FIG. 20A has green and panchromatic pixels arranged as in FIG. 21B, but the red and blue pixels are not so arranged. After FIG. 21B, an arrangement such as in FIG. 21C is preferred, but FIG. 20A does not have this either with respect to the red or blue pixels. FIG. 20B does not have the patterns of FIG. 21B or FIG. 21C for any color pixels. Tanaka et al. (U.S. Pat. No. 4,437,112) describe a number of CFA patterns of which the most relevant one to this discussion is FIG. 22. In FIG. 22 cyan (C), yellow (Y), green (G), and panchromatic (P) pixels are arranged so that the green pixels are surrounded by the neighborhood shown in FIG. 21C. However, the yellow and cyan pixels do not conform to the patterns of either FIG. 21B or FIG. 21C. The same difficulties exist with the other patterns taught by Tanaka et al.

Hamilton et al. (U.S. Pat. Appl. No. 2007/0024879) teach a large number of CFA patterns of which two are shown in FIGS. 23A and 23B. The liabilities of these, as well as all of the other patterns disclosed in Hamilton et al., are the lack of FIG. 21B and FIG. 21C pixel arrangements.

Kijima et al. (U.S. Pat. Appl. No. 2007/0177236) describe a large number of CFA patterns of which the most relevant CFA pattern is shown in FIG. 24. While the double row of panchromatic pixels provides a FIG. 21C arrangement in the vertical direction, no such horizontal arrangement of side-by-side panchromatic values exists in FIG. 24.

Thus, there exists a need for a four-channel CFA pattern with three narrowband color channels and one broadband panchromatic channel with enough color pixels to provide sufficient color spatial resolution and arranged in such a way as to permit the effective nonlinear interpolation of the missing panchromatic values.

SUMMARY OF THE INVENTION

In accordance with the present invention, there is provided an image sensor for capturing a color image comprising a two dimensional array of light-sensitive pixels including panchromatic pixels and color pixels having at least three different color responses, the pixels being arranged in a rectangular minimal repeating unit having at least eight pixels and having at least two rows and two columns, wherein for a first color response, the color pixels having the first color response alternate with panchromatic pixels in at least two directions, and for each of the other color responses there is at least one row, column or diagonal of the repeating pattern that only has color pixels of the given color response and panchromatic pixels.

An advantage of the present invention is that the color spatial resolution of the image is improved without the need of increasing the percentage of color pixels with respect to panchromatic pixels within the sensor.

A further advantage of the present invention is that a reduction of color noise in the image is realized without the need for increasing the spectral bandwidth of the color pixels with the correspondingly reduction of color fidelity of the image.

This and other aspects, objects, features, and advantages of the present invention will be more clearly understood and appreciated from a review of the following detailed description of the preferred embodiments and appended claims, and by reference to the accompanying drawings.

BRIEF DESCRIPTION OF THE DRAWINGS

FIG. 1 is a block diagram of a digital camera for implementing the present invention;

FIG. 2 is a minimum repeating unit from the prior art;

FIG. 3 is a minimum repeating unit for the preferred embodiment of the present invention;

FIG. 4A and FIG. 4B are minimum repeating units for an alternate embodiment of the present invention;

FIG. 5A and FIG. 5B are minimum repeating units for an alternate embodiment of the present invention;

FIG. 7 is a pixel neighborhood used in interpolating panchromatic image values;

FIG. 8 is a pixel neighborhood used in interpolating panchromatic image values;

FIG. 9A and FIG. 9B are pixel neighborhoods used in interpolating panchromatic image values;

FIG. 11A and FIG. 11B are pixel neighborhoods used in interpolating panchromatic image values;

FIG. 13 is a pixel neighborhood used in interpolating color difference values;

FIG. 14 is a pixel neighborhood used in interpolating color difference values;

FIG. 15A and FIG. 15B are pixel neighborhoods used in interpolating color difference values;

FIG. 16A and FIG. 16B are pixel neighborhoods used in interpolating color difference values;

FIG. 19 is a minimum repeating unit from the prior art;

FIG. 20A and FIG. 20B are minimum repeating units from the prior art;

Figure 22:
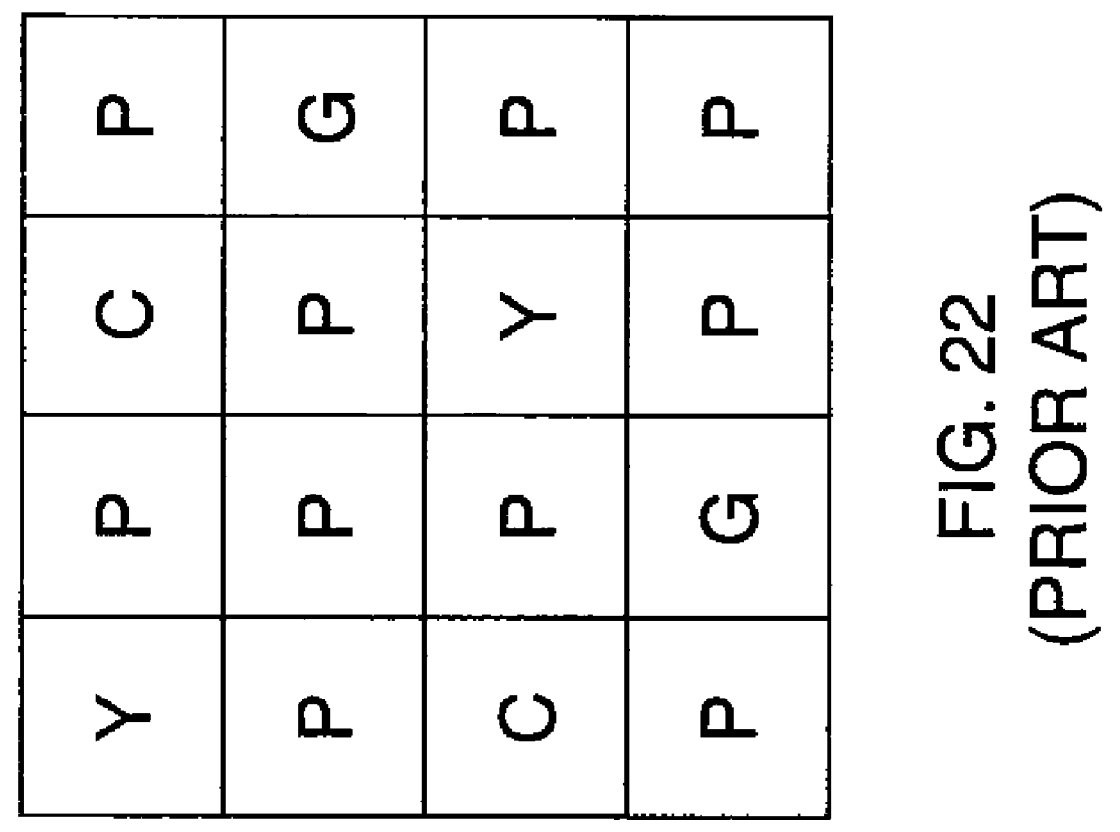

FIG. 22 is a minimum repeating unit from the prior art;

FIG. 23A and FIG. 23B are minimum repeating units from the prior art;

FIG. 24 is a minimum repeating unit from the prior art; and

FIG. 25 is a minimum repeating unit for an alternate embodiment of the present invention.

DETAILED DESCRIPTION OF THE INVENTION

Figure 6:
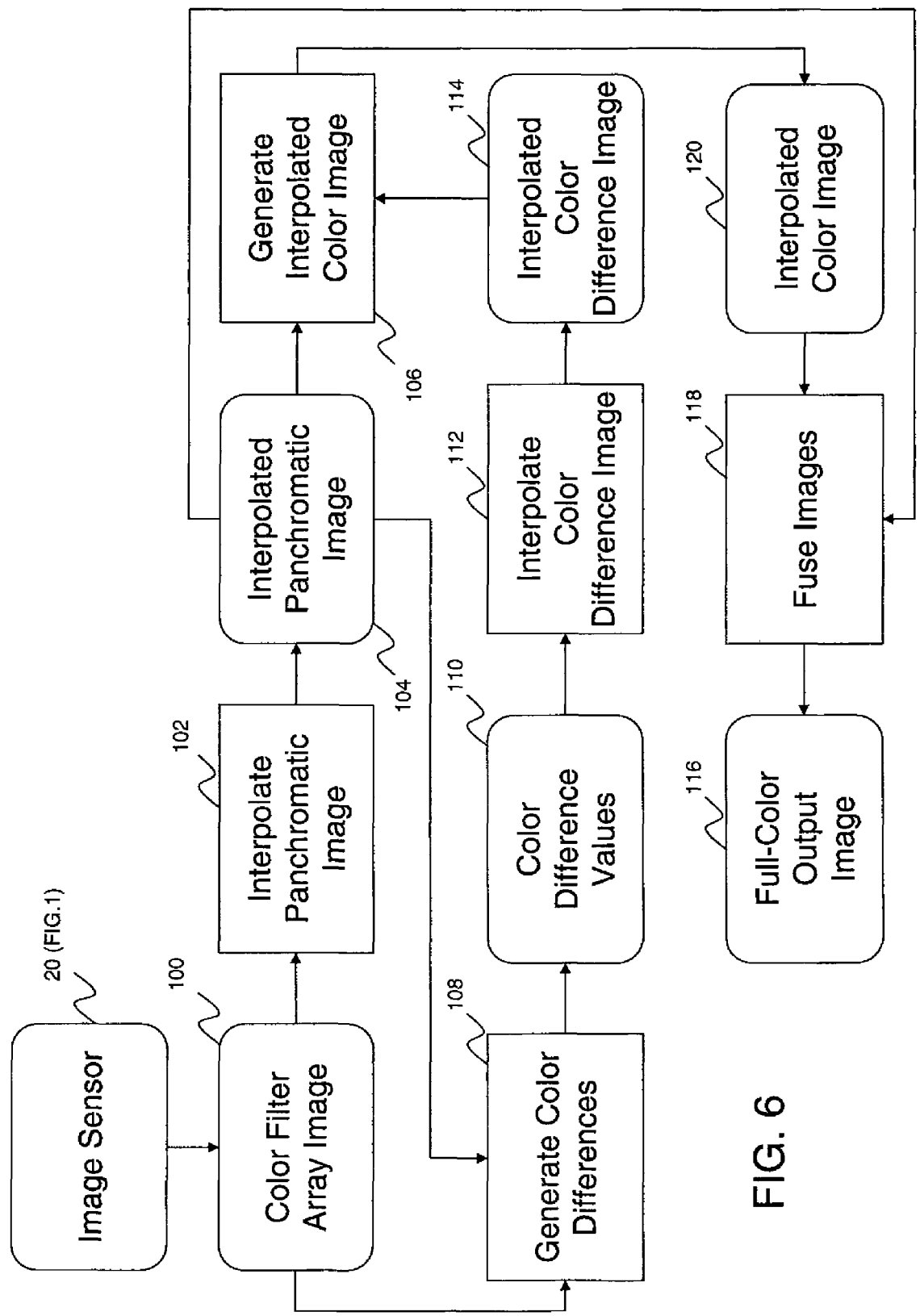
FIG. 6 is an overview of the image processing chain for a preferred embodiment of the present invention.

In the following description, a preferred embodiment of the present invention will be described in terms that would ordinarily be implemented as a software program. Those skilled in the art will readily recognize that the equivalent of such software can also be constructed in hardware. Because image manipulation algorithms and systems are well known, the present description will be directed in particular to algorithms and systems forming part of, or cooperating more directly with, the system and method in accordance with the present invention. Other aspects of such algorithms and systems, and hardware or software for producing and otherwise processing the image signals involved therewith, not specifically shown or described herein, can be selected from such systems, algorithms, components and elements known in the art. Given the system as described according to the invention in the following materials, software not specifically shown, suggested or described herein that is useful for implementation of the invention is conventional and within the ordinary skill in such arts.

Still further, as used herein, the computer program for performing the method of the present invention can be stored in a computer readable storage medium, which can include, for example; magnetic storage media such as a magnetic disk (such as a hard drive or a floppy disk) or magnetic tape; optical storage media such as an optical disc, optical tape, or machine readable bar code; solid state electronic storage devices such as random access memory (RAM), or read only memory (ROM); or any other physical device or medium employed to store a computer program.

Because digital cameras employing imaging devices and related circuitry for signal capture and correction and for exposure control are well known, the present description will be directed in particular to elements forming part of, or cooperating more directly with, the method and apparatus in accordance with the present invention. Elements not specifically shown or described herein are selected from those known in the art. Certain aspects of the embodiments to be described are provided in software. Given the system as shown and described according to the invention in the following materials, software not specifically shown, described or suggested herein that is useful for implementation of the invention is conventional and within the ordinary skill in such arts.

Turning now to FIG. 1, a block diagram of an image capture device embodying the present invention is shown. In this example, the image capture device is shown as a digital camera. However, although a digital camera will now be explained, the present invention is clearly applicable to other types of image capture devices as well. In the disclosed camera, light from the subject scene 10 is input to an imaging stage 11, where the light is focused by lens 12 to form an image on a solid state color filter array image sensor 20. Color filter array image sensor 20 converts the incident light to an electrical signal for each picture element (pixel). The color filter array image sensor 20 of the preferred embodiment is a charge coupled device (CCD) type or an active pixel sensor (APS) type. (APS devices are often referred to as CMOS sensors because of the ability to fabricate them in a Complementary Metal Oxide Semiconductor process.) Other types of image sensors having two-dimensional array of pixels can also be used provided that they employ the patterns of the present invention. The color filter array image sensor 20 for use in the present invention comprises a two-dimensional array of color and panchromatic pixels as will become clear later in this specification after FIG. 1 is described.

The amount of light reaching the color filter array image sensor 20 is regulated by an iris block 14 that varies the aperture and a neutral density (ND) filter block 13 that includes one or more ND filters interposed in the optical path. Also regulating the overall light level is the time that a shutter 18 is open. An exposure controller 40 responds to the amount of light available in the scene as metered by a brightness sensor block 16 and controls all three of these regulating functions.

This description of a particular camera configuration will be familiar to one skilled in the art, and it will be obvious that many variations and additional features are present. For example, an autofocus system can be added, or the lens can be detachable and interchangeable. It will be understood that the present invention can be applied to any type of digital camera, where similar functionality is provided by alternative components. For example, the digital camera can be a relatively simple point-and-shoot digital camera, where the shutter 18 is a relatively simple movable blade shutter, or the like, instead of the more complicated focal plane arrangement. The present invention can also be practiced using imaging components included in non-camera devices such as mobile phones and automotive vehicles.

The analog signal from the color filter array image sensor 20 is processed by analog signal processor 22 and applied to analog-to-digital (A/D) converter 24. A timing generator 26 produces various clocking signals to select rows and pixels and synchronizes the operation of analog signal processor 22 and A/D converter 24. An image sensor stage 28 includes the color filter array image sensor 20, the analog signal processor 22, the A/D converter 24, and the timing generator 26. The components of image sensor stage 28 can be separately fabricated integrated circuits, or they can be fabricated as a single integrated circuit as is commonly done with CMOS image sensors. The resulting stream of digital pixel values from the A/D converter 24 is stored in a digital signal processor (DSP) memory 32 associated with a digital signal processor (DSP) 36.

The DSP 36 is one of three processors or controllers in this embodiment, in addition to a system controller 50 and an exposure controller 40. Although this partitioning of camera functional control among multiple controllers and processors is typical, these controllers or processors can be combined in various ways without affecting the functional operation of the camera and the application of the present invention. These controllers or processors can include one or more digital signal processor devices, microcontrollers, programmable logic devices, or other digital logic circuits. Although a combination of such controllers or processors has been described, it should be apparent that one controller or processor can be designated to perform all of the needed functions. All of these variations can perform the same function and fall within the scope of this invention, and the term "processing stage" will be used as needed to encompass all of this functionality within one phrase, for example, as in processing stage 38 in FIG. 1.

In the illustrated embodiment, DSP 36 manipulates the digital image data in the DSP memory 32 according to a software program permanently stored in a program memory 54 and copied to DSP memory 32 for execution during image capture. DSP 36 executes the software necessary for practicing image processing shown in FIG. 18. DSP memory 32 can be any type of random access memory, such as SDRAM. The bus 30 including a pathway for address and data signals connects DSP 36 to its related DSP memory 32, A/D converter 24 and other related devices.

System controller 50 controls the overall operation of the camera based on a software program stored in program memory 54, which can include Flash EEPROM or other nonvolatile memory. This memory can also be used to store image sensor calibration data, user setting selections and other data which must be preserved when the camera is turned off. System controller 50 controls the sequence of image capture by directing exposure controller 40 to operate the lens 12, ND filter block 13, iris block 14, and shutter 18 as previously described, directing the timing generator 26 to operate the color filter array image sensor 20 and associated elements, and directing DSP 36 to process the captured image data. After an image is captured and processed, the final image file stored in DSP memory 32 is transferred to a host computer via host interface 57, stored on a removable memory card 64 or other storage device, and displayed for the user on an image display 88.

A system controller bus 52 includes a pathway for address, data and control signals, and connects system controller 50 to DSP 36, program memory 54, a system memory 56, host interface 57, a memory card interface 60 and other related devices. Host interface 57 provides a high speed connection to a personal computer (PC) or other host computer for transfer of image data for display, storage, manipulation or printing. This interface can be an IEEE1394 or USB2.0 serial interface or any other suitable digital interface. Memory card 64 is typically a Compact Flash (CF) card inserted into memory card socket 62 and connected to the system controller 50 via memory card interface 60. Other types of storage that can be utilized include without limitation PC-Cards, MultiMedia Cards (MMC), or Secure Digital (SD) cards.

Processed images are copied to a display buffer in system memory 56 and continuously read out via video encoder 80 to produce a video signal. This signal is output directly from the camera for display on an external monitor, or processed by display controller 82 and presented on image display 88. This display is typically an active matrix color liquid crystal display (LCD), although other types of displays are used as well.

A user interface 68, including all or any combination of a viewfinder display 70, an exposure display 72, a status display 76, the image display 88, and user inputs 74, is controlled by a combination of software programs executed on exposure controller 40 and system controller 50. User inputs 74 typically include some combination of buttons, rocker switches, joysticks, rotary dials or touchscreens. Exposure controller 40 operates light metering, exposure mode, autofocus and other exposure functions. The system controller 50 manages a graphical user interface (GUI) presented on one or more of the displays, e.g., on image display 88. The GUI typically includes menus for making various option selections and review modes for examining captured images.

Exposure controller 40 accepts user inputs selecting exposure mode, lens aperture, exposure time (shutter speed), and exposure index or ISO speed rating and directs the lens 12 and shutter 18 accordingly for subsequent captures. The brightness sensor block 16 is employed to measure the brightness of the scene and provide an exposure meter function for the user to refer to when manually setting the ISO speed rating, aperture and shutter speed. In this case, as the user changes one or more settings, the light meter indicator presented on viewfinder display 70 tells the user to what degree the image will be over or underexposed. In an automatic exposure mode, the user changes one setting and the exposure controller 40 automatically alters another setting to maintain correct exposure, e.g., for a given ISO speed rating when the user reduces the lens aperture, the exposure controller 40 automatically increases the exposure time to maintain the same overall exposure.

The ISO speed rating is an important attribute of a digital still camera. The exposure time, the lens aperture, the lens transmittance, the level and spectral distribution of the scene illumination, and the scene reflectance determine the exposure level of a digital still camera. When an image from a digital still camera is obtained using an insufficient exposure, proper tone reproduction can generally be maintained by increasing the electronic or digital gain, but the resulting image will often contain an unacceptable amount of noise. As the exposure is increased, the gain is decreased, and therefore the image noise can normally be reduced to an acceptable level. If the exposure is increased excessively, the resulting signal in bright areas of the image can exceed the maximum signal level capacity of the image sensor or camera signal processing. This can cause image highlights to be clipped to form a uniformly bright area, or to "bloom" into surrounding areas of the image. Therefore, it is important to guide the user in setting proper exposures. An ISO speed rating is intended to serve as such a guide. In order to be easily understood by photographers, the ISO speed rating for a digital still camera should directly relate to the ISO speed rating for photographic film cameras. For example, if a digital still camera has an ISO speed rating of ISO 200, then the same exposure time and aperture should be appropriate for an ISO 200 rated film/process system.

The ISO speed ratings are intended to harmonize with film ISO speed ratings. However, there are differences between electronic and film-based imaging systems that preclude exact equivalency. Digital still cameras can include variable gain, and can provide digital processing after the image data has been captured, enabling tone reproduction to be achieved over a range of camera exposures. It is therefore possible for digital still cameras to have a range of speed ratings. This range is defined as the ISO speed latitude. To prevent confusion, a single value is designated as the inherent ISO speed rating, with the ISO speed latitude upper and lower limits indicating the speed range, that is, a range including effective speed ratings that differ from the inherent ISO speed rating. With this in mind, the inherent ISO speed is a numerical value calculated from the exposure provided at the focal plane of a digital still camera to produce specified camera output signal characteristics. The inherent speed is usually the exposure index value that produces peak image quality for a given camera system for normal scenes, where the exposure index is a numerical value that is inversely proportional to the exposure provided to the image sensor.

The foregoing description of a digital camera will be familiar to one skilled in the art. It will be obvious that there are many variations of this embodiment that are possible and are selected to reduce the cost, add features or improve the performance of the camera. The following description will disclose in detail the operation of this camera for capturing images according to the present invention. Although this description is with reference to a digital camera, it will be understood that the present invention applies for use with any type of image capture device having an image sensor with color and panchromatic pixels.

The color filter array image sensor 20 shown in FIG. 1 typically includes a two-dimensional array of light sensitive pixels fabricated on a silicon substrate that provide a way of converting incoming light at each pixel into an electrical signal that is measured. As the color filter array image sensor 20 is exposed to light, free electrons are generated and captured within the electronic structure at each pixel. Capturing these free electrons for some period of time and then measuring the number of electrons captured, or measuring the rate at which free electrons are generated can measure the light level at each pixel. In the former case, accumulated charge is shifted out of the array of pixels to a charge-to-voltage measurement circuit as in a charge coupled device (CCD), or the area close to each pixel can contain elements of a charge-to-voltage measurement circuit as in an active pixel sensor (APS or CMOS sensor).

Whenever general reference is made to an image sensor in the following description, it is understood to be representative of the color filter array image sensor 20 from FIG. 1. It is further understood that all examples and their equivalents of image sensor architectures and pixel patterns of the present invention disclosed in this specification is used for color filter array image sensor 20.

In the context of an image sensor, a pixel (a contraction of "picture element") refers to a discrete light sensing area and charge shifting or charge measurement circuitry associated with the light sensing area. In the context of a digital color image, the term pixel commonly refers to a particular location in the image having associated color values.

Figures 2, 3:
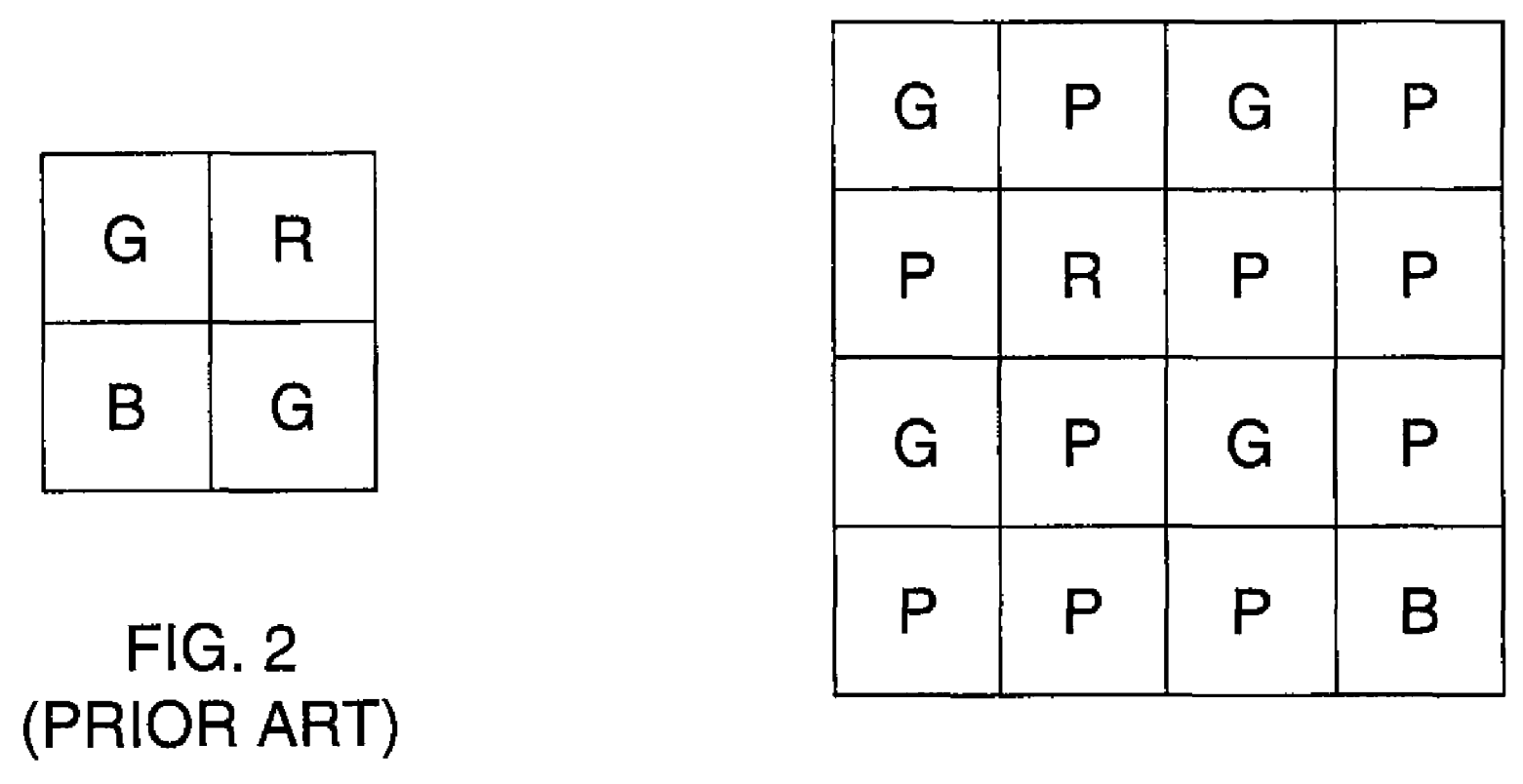

FIG. 2 is an example of a minimum repeating unit of a well-known color filter array pattern described by Bayer in U.S. Pat. No. 3,971,065. The minimum repeating unit is repeated over the surface of the color filter array sensor 20 (FIG. 1) thereby producing either a red pixel, green pixel, or blue pixel at each pixel location. The data produced by color filter array sensor 20 (FIG. 1) with the color filter array pattern of FIG. 2 can be used to produce a full-color image in many ways known to those skilled in the art. One example is described by Adams et al. in U.S. Pat. No. 5,506,619.

FIG. 3 is the minimum repeating unit for a preferred embodiment of the present invention. It is a 4×4 square array of pixels with green pixels alternating horizontally and vertically with panchromatic pixels and red and blue pixels that each have three adjacent panchromatic pixels in each of four directions (to the left, to the right, above, and below). This minimum repeating unit of FIG. 3 is repeated over the surface of the color filter array sensor 20 (FIG. 1) thereby producing either a red pixel, green pixel, blue pixel, or panchromatic pixel at each pixel location. As a result the panchromatic pixels are arranged in a checkerboard pattern over the surface of sensor. The color pixels are also arranged in a checkerboard pattern over the surface of the sensor.

Figures 4A, 4B:
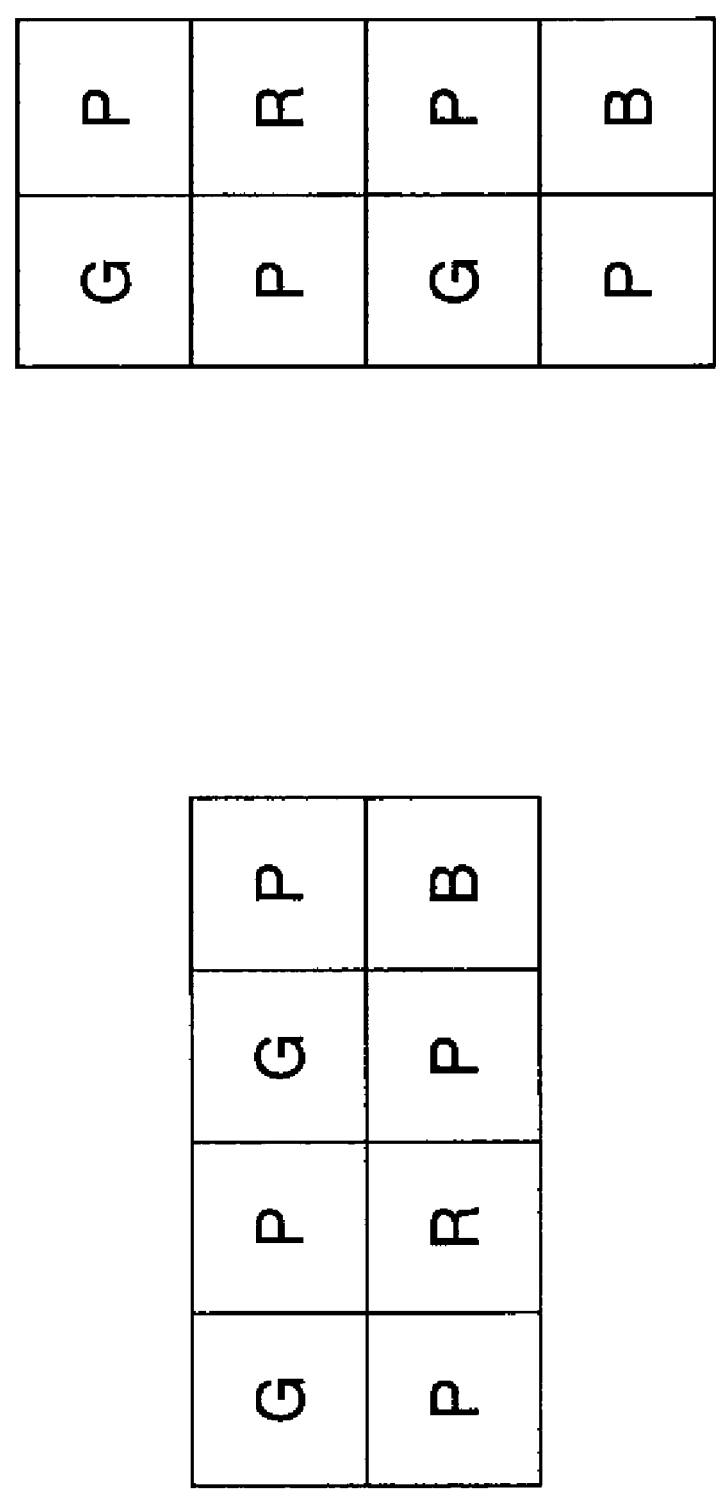

FIG. 4A shows a minimum repeating unit for an alternate embodiment of the present invention. It is a 2×4 rectangular array of pixels with green pixels alternating horizontally and vertically with panchromatic pixels and red and blue pixels alternating vertically with panchromatic pixels. This arrangement can be transposed to obtain the pattern of FIG. 4B, which shows a 4×2 rectangular array of pixels with green pixels alternating horizontally and vertically with panchromatic pixels and the red and blue pixels alternating horizontally with panchromatic pixels. The minimum repeating unit of FIG. 4A or 4B is tiled over the surface of the color filter array sensor 20 (FIG. 1) thereby producing either a red pixel, green pixel, blue pixel, or panchromatic pixel at each pixel location. As a result the panchromatic pixels are arranged in a checkerboard pattern over the surface of sensor. The color pixels are also arranged in a checkerboard pattern over the surface of the sensor.

FIG. 5A shows a 4×4 minimum repeating unit for another alternate embodiment of the present invention. This arrangement is similar to that shown in FIG. 3 except that the color pixels alternate with the panchromatic pixels in diagonal directions rather than horizontally and vertically. In particular, it can be seen that the red, green, and blue pixels alternate diagonally with panchromatic pixels in both diagonal directions. (Note that the full pattern along the diagonals can best be visualized by tiling the minimal repeating units to see how the lines of pixels wrap around from one side of the minimal repeating unit to the other.) In this arrangement, it can be seen that columns of color pixels alternate with columns of panchromatic pixels. This arrangement can be transposed to obtain the pattern of FIG. 5B which is a 4×4 square array of pixels with red, green, and blue pixels alternating diagonally with panchromatic pixels in both diagonal directions. In this case, rows of color pixels alternate with rows of panchromatic pixels.

The minimum repeating unit of FIG. 5A or FIG. 5B is tiled over the surface of the color filter array sensor 20 (FIG. 1) thereby producing either a red pixel, green pixel, blue pixel, or panchromatic pixel at each pixel location. As a result the panchromatic pixels are arranged in either alternating rows or columns over the surface of sensor. The color pixels are also arranged in either alternating rows or columns over the surface of the sensor. This can be advantageous for sensor designs where there may be small differences in gain for even and odd rows (or columns) of the sensor. Having all pixels of a given type on either the even or odd rows can reduce artifacts that are sometimes produced during the CFA interpolation process as a result of the alternating gain values.

The present invention can be generalized to CFA patterns of other sizes and arrangements besides the CFA patterns shown in FIGS. 3, 4A, 4B, 5A, and 5B. In each case, the pixels will be arranged in a rectangular minimal repeating unit having at least eight pixels and having at least two rows and two columns, wherein for a first color response, the color pixels having the first color response alternate with panchromatic pixels in at least two directions, and for each of the other color responses there is at least one row, column or diagonal of the repeating pattern that only has color pixels of the given color response and panchromatic pixels.

Another way to describe CFA patterns according to the present invention is that the pixels are arranged in a repeating pattern having a rectangular minimal repeating unit having at least eight pixels and having at least two rows and two columns, wherein the color pixels for at least one color response alternate with panchromatic pixels in at least two directions, and wherein the color pixels for the other color responses either alternate with panchromatic pixels in at least one direction or have at least two adjacent panchromatic pixels on both sides of the color pixel in at least two directions.

Figure 25:
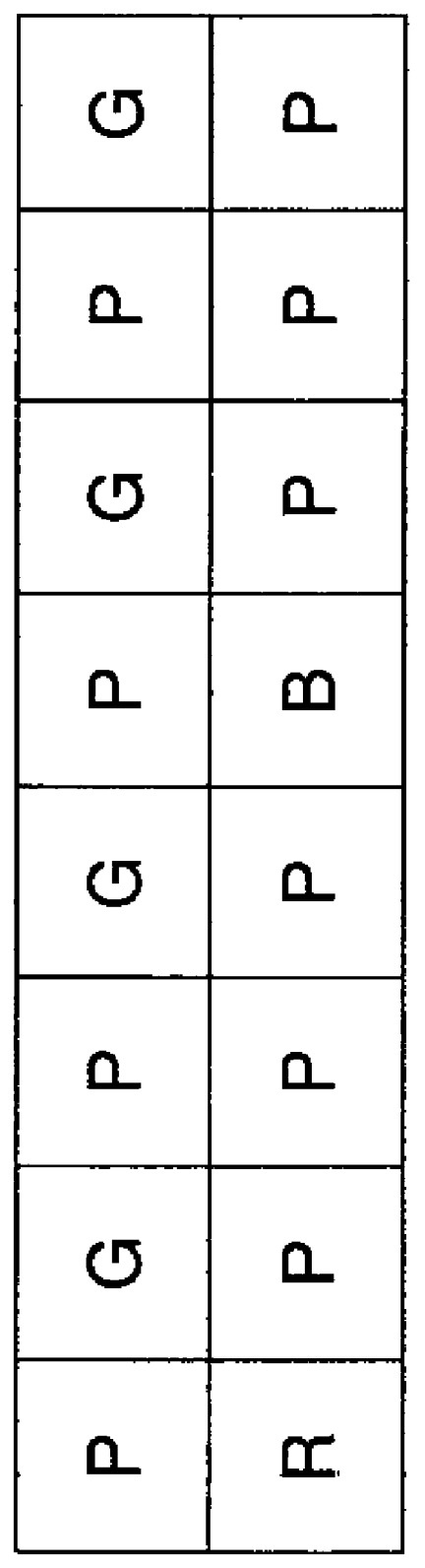

FIG. 25 shows another example of a minimal repeating unit having a 2×8 rectangular array of pixels satisfying these criteria. In this case, green pixels alternate horizontally and vertically with panchromatic pixels, and red and blue pixels alternate vertically with panchromatic pixels and are flanked horizontally with three panchromatic pixels to the left and right.

A desirable characteristic of the CFA patterns that satisfy the above criteria is fact that every color pixel is surrounded by four panchromatic pixels (either horizontally/vertically or diagonally). As a result, highly accurate interpolated panchromatic values can be easily determined at the locations of the color pixels by interpolating between the surrounding panchromatic pixels. Furthermore, the color pixels for at least one color response alternate with panchromatic pixels in at least two directions. Therefore, the color pixels for at least one color response (e.g., green) will be arranged on a regular grid enabling easy interpolation of the corresponding color differences. The color pixels for the other color responses (e.g., red and blue) will also occur on a regular grid, although the repeat period may be larger than for the one color response in either one or both directions. The larger periods will be associated with correspondingly larger interpolation errors for the interpolated color differences. However, these color responses are less important visually so that the visibility of any artifacts will be less objectionable.

The color pixels in the example CFA patterns shown in FIGS. 3, 4A, 4B, 5A, 5B and 25 are red, green and blue. It will be understood by one skilled in the art that other types of color pixels can also be used in accordance with the present invention. For example, in an alternate embodiment of the present invention the color pixels can be cyan, magenta and yellow. In another embodiment of the present invention the color pixels can be cyan, yellow and green. In yet another embodiment of the present invention the color pixels can be cyan, magenta, yellow and green. Many other types and combinations of color pixels can also be used.

FIG. 6 is a high-level diagram of an algorithm for producing a full-color output image from the data produced from minimum repeating units such as those shown in FIG. 3, 4A, 4B, 5A, 5B or 25 according to a preferred embodiment of the present invention. The image sensor 20 (FIG. 1) produces a color filter array image 100. In the color filter array image 100 each pixel location is either a red, green, blue, or panchromatic pixel as determined by the minimum repeating units such as those shown in FIG. 3, 4A, 4B, 5A, 5B or 25. An interpolate panchromatic image block 102 produces an interpolated panchromatic image 104 from the color filter array image 100. A generate color differences block 108 produces color difference values 110 from the color filter array image 100 and the interpolated panchromatic image 104. An interpolate color difference image block 112 produces an interpolated color difference image 114 from the color difference images 110. A generate interpolated color image block 106 produces an interpolated color image 120 from the interpolated panchromatic image 104 and the interpolated color difference image 114. Finally, a fuse images block 118 produces a full-color output image 116 from the interpolated panchromatic image 104 and the interpolated color image 120.

Each of the steps of the method shown in FIG. 6 will now be described in more detail. FIG. 7 is a detailed diagram of a pixel neighborhood used in the interpolate panchromatic image block 102 (FIG. 6) to determine interpolated panchromatic pixels values at the locations of the green pixels in the CFA pattern shown in FIG. 3. In FIG. 7, $C_2$, $C_5$, $C_7$, $C_9$, and $C_C$ refer to green pixel values and $P_1$, $P_3$, $P_4$, $P_6$, $P_8$, $P_A$, $P_B$ and $P_D$ refer to panchromatic pixel values from the color filter array image 100 (FIG. 6). In order to produce the interpolated panchromatic value P'$_7$ the following computations are performed.

$$h = 2|P_6 - P_8| + \alpha|C_5 - 2C_7 + C_9|$$
$$v = 2|P_3 - P_B| + \alpha|C_2 - 2C_7 + C_C|$$
$$H = \frac{P_6 + P_8}{2} + \alpha\frac{-C_5 + 2C_7 - C_9}{8}$$
$$V = \frac{P_3 + P_B}{2} + \alpha\frac{-C_2 + 2C_7 - C_C}{8}$$
$$P'_7 = \frac{h}{h+v}V + \frac{v}{h+v}H$$

where α is a constant, and h, v, H, and V are intermediate variables. The value of α in the preferred embodiment of this invention is zero. In an alternate embodiment of this invention, the value of α is one. It will be obvious to one skilled in the art that other values of α can also be used. Changing the value of α has the effect of controlling how much the color pixel values are weighted in the process of determining the interpolated panchromatic value P'$_7$. These computations are repeated by the interpolate panchromatic image block 102 (FIG. 6) at each green pixel location in the color filter array image 100 (FIG. 6) to produce the corresponding interpolated panchromatic values P'$_7$.

FIG. 8 is a detailed diagram of a pixel neighborhood used in the interpolate panchromatic image block 102 (FIG. 6) to determine interpolated panchromatic pixels values at the locations of the red and blue pixels in the CFA pattern shown in FIG. 3. In FIG. 8, $C_1$, $C_5$, $C_9$, $C_D$, and $C_H$ refer to color pixels of the same color (red or blue) and $P_2$, $P_3$, $P_4$, $P_6$, $P_7$, $P_8$, $P_A$, $P_B$, $P_C$, $P_E$, $P_F$ and $P_G$ refer to panchromatic pixels from the color filter array image 100 (FIG. 6). In FIG. 8, there are three adjacent panchromatic pixel values above, below, to the left, and to the right of $C_9$. In order to produce the interpolated panchromatic value P'$_9$ the following computations are performed.

$$h = |P_7 - P_8| + |P_8 - P_A| + |P_A - P_B| + \alpha|C_5 - 2C_9 + C_D|$$
$$v = |P_3 - P_4| + |P_4 - P_E| + |P_E - P_F| + \alpha|C_1 - 2C_9 + C_H|$$
$$H = \frac{-P_7 + 4P_8 + 4P_A - P_B}{6} + \alpha\frac{-C_5 + 2C_9 - C_D}{16}$$
$$V = \frac{-P_3 + 4P_4 + 4P_E - P_F}{6} + \alpha\frac{-C_1 + 2C_9 - C_H}{16}$$
$$P'_9 = \frac{h}{h+v}V + \frac{v}{h+v}H$$

where α is a constant, and h, v, H, and V are intermediate variables. The value of α in the preferred embodiment of this invention is zero. In an alternate embodiment of this invention, the value of a is one. It will be obvious to one skilled in the art that other values of a can also be used. Changing the value of α has the effect of controlling how much the color pixel values are weighted in the process of determining the interpolated panchromatic value P'$_9$. These computations are repeated by the interpolate panchromatic image block 102 (FIG. 6) at each red and blue color pixel location in the color filter array image 100 (FIG. 6) to produce the corresponding interpolated panchromatic values P'$_9$. The interpolated panchromatic values (at the red, green and blue pixel locations) combined with the original panchromatic values make up the interpolated panchromatic image 104 (FIG. 6).

Similar calculations can be used in the interpolate panchromatic image block 102 (FIG. 6) for the alternate CFA patterns described earlier. For the CFA patterns shown in FIGS. 4A and 4B, the green pixels alternate with the panchromatic pixels in the same manner as in FIG. 3. Therefore, the interpolation method previously described with respect to FIG. 7 can also be applied to the CFA patterns of FIGS. 4A and 4B. FIGS. 9A and 9B are detailed diagrams of pixel neighborhoods than can be used in the interpolate panchromatic image block 102 (FIG. 6) for the red and blue pixels in the CFA pattern shown in FIGS. 4A and 4B. FIG. 9A corresponds to the CFA pattern of FIG. 4A and FIG. 9B corresponds to the CFA pattern of FIG. 4B. In FIG. 9A, $C_2$, $C_B$, and $C_K$ are red pixels and $D_9$ and $D_D$ are blue pixels or $C_2$, $C_B$, and $C_K$ are blue pixels and $D_9$ and $D_D$ are red pixels. $G_4$, $G_6$, $G_G$, and $G_I$ are green pixels and $P_1$, $P_3$, $P_5$, $P_7$, $P_8$, $P_A$, $P_C$, $P_E$, $P_F$, $P_H$, $P_J$ and $P_L$ are panchromatic pixels. In order to produce the interpolated panchromatic value P'$_B$ the following computations are performed.

$$h = 4|P_A - P_C| + |P_3 - 2P_5 + P_7| + |P_F - 2P_H + P_J|$$
$$v = 2|P_5 - P_H| + \alpha|C_2 - 2C_B + C_K|$$
$$H = \frac{-P_8 + 9P_A + 9P_C - P_E}{16}$$
$$V = \frac{P_5 + P_H}{2} + \alpha\frac{-C_2 + 2C_B - C_K}{8}$$
$$P'_B = \frac{h}{h+v}V + \frac{v}{h+v}H$$

where α is a constant, and h, v, H, and V are intermediate variables. The value of α in the preferred embodiment of this invention is zero. In an alternate embodiment of this invention, the value of α is one. It will be obvious to one skilled in the art that other values of a can also be used. Changing the value of α has the effect of controlling how much the color pixel values are weighted in the process of determining the interpolated panchromatic value P'$_B$. In FIG. 9B, $C_9$, $C_B$, and $C_D$ are red pixels and $D_3$ and $D_J$ are blue pixels, or $C_9$, $C_B$, and $C_D$ are blue pixels and $D_3$ and $D_J$ are red pixels. $G_5$, $G_7$, $G_F$, and $G_H$ are green pixels and $P_1$, $P_3$, $P_5$, $P_7$, $P_8$, $P_A$, $P_C$, $P_E$, $P_F$, $P_H$, $P_J$ and $P_L$ are panchromatic pixels. In order to produce the interpolated panchromatic value P'$_B$ the following computations are performed.

$$h = 2|P_A - P_C| + \alpha|C_9 - 2C_B + C_D|$$
$$v = 4|P_6 - P_G| + |P_2 - 2P_A + P_1| + |P_4 - 2P_C + P_K|$$
$$H = \frac{P_A + P_C}{2} + \alpha\frac{-C_9 + 2C_B - C_D}{8}$$
$$V = \frac{-P_1 + 9P_6 + 9P_G - P_L}{16}$$
$$P'_B = \frac{h}{h+v}V + \frac{v}{h+v}H$$

where α is a constant, and h, v, H, and V are intermediate variables. The value of α in the preferred embodiment of this invention is zero. In an alternate embodiment of this invention, the value of α is one. It will be obvious to one skilled in the art that other values of α can also be used. Changing the value of α has the effect of controlling how much the color pixel values are weighted in the process of determining the interpolated panchromatic value P'$_B$.

Figure 10:
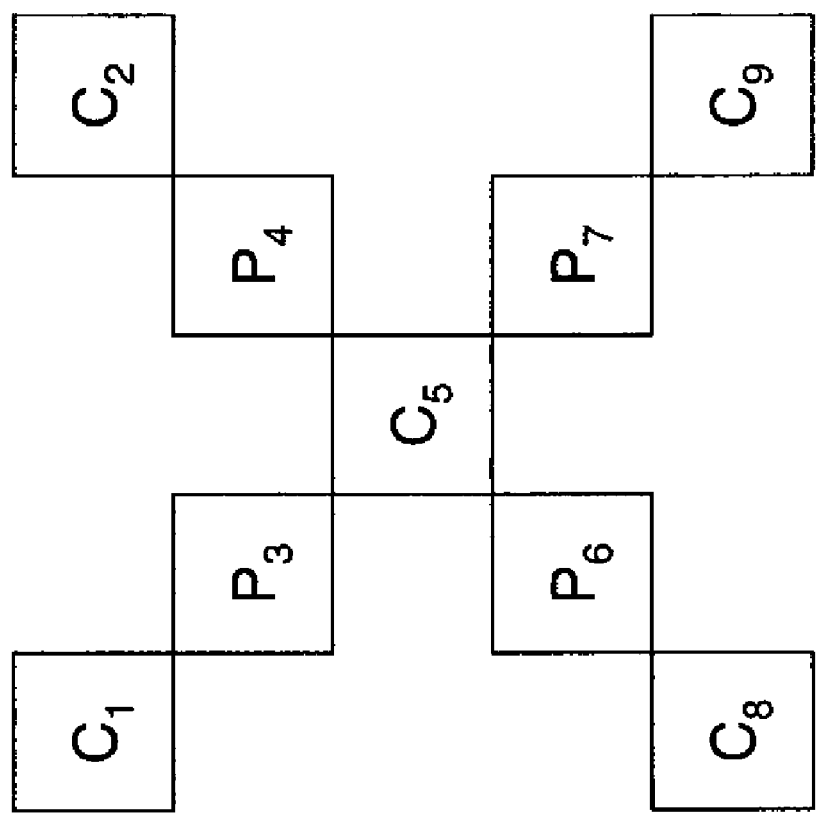
FIG. 10 is a pixel neighborhood used in interpolating panchromatic image values.

FIG. 10 is a detailed diagram of a pixel neighborhood for use in the interpolate panchromatic image block 102 (FIG. 6) for the CFA patterns shown in FIGS. 5A and 5B. In FIG. 10, C$_1$, C$_2$, C$_5$, C$_8$, and C$_9$ refer to color pixels of the same color from the color filter array image 100 (FIG. 6). P$_3$, P$_4$, P$_6$, and P$_7$ refer to panchromatic pixels. In FIG. 10, panchromatic pixels alternate with the color pixels in both diagonal directions. In order to produce the interpolated panchromatic value P'$_5$ the following computations are performed.

$$s = 2|P_4 - P_6| + \alpha|C2 - 2C_5 + C_8|$$
$$b = 2|P_3 - P_7| + \alpha|C_1 - 2C_5 + C_9|$$
$$S = \frac{P_4 + P_6}{2} + \alpha\frac{-C_2 + 2C_5 - C_8}{8}$$
$$B = \frac{P_3 + P_7}{2} + \alpha\frac{-C_1 + 2C_5 - C_9}{8}$$
$$P'_5 = \frac{s}{s+b}B + \frac{b}{s+b}S$$

where α is a constant, and s, b, S, and B are intermediate variables. The value of α in the preferred embodiment of this invention is zero. In an alternate embodiment of this invention, the value of α is one. It will be obvious to one skilled in the art that other values of α can also be used. Changing the value of α has the effect of controlling how much the color pixel values are weighted in the process of determining the interpolated panchromatic value P'$_5$. These computations are repeated by the interpolate panchromatic image block 102 (FIG. 6) at each color pixel location in the color filter array image 100 (FIG. 6) to produce the corresponding interpolated panchromatic values P'$_5$. The interpolated panchromatic values combined with the original panchromatic values (P$_3$, P$_4$, P$_6$, and P$_7$ in FIG. 10) make up the interpolated panchromatic image 104 (FIG. 6).

FIGS. 11A and 11B are detailed diagrams of pixel neighborhoods that can be used for an alternate embodiment of the interpolate panchromatic image block 102 (FIG. 6) for the CFA pattern shown in FIG. 5A. In FIG. 11A, C$_3$ is either a red or blue pixel and D$_B$ is either a blue or red pixel, respectively, from the color filter array image 100 (FIG. 6). G$_1$, G$_5$, G$_7$, G$_9$, and G$_D$ are green pixels and P$_2$, P$_4$, P$_6$, P$_8$, P$_A$ and P$_C$ are panchromatic pixels. In FIG. 11A, panchromatic pixels alternate with the green pixels in the horizontal direction. In order to produce the interpolated panchromatic value P'$_7$ the following computations are performed.

$$h = 2|P_6 - P_8| + \alpha|G_5 - 2G_7 + G_9|$$
$$v = |P_2 - P_6| + |P_6 - P_A| + |P_4 - P_8| + |P_8 - P_C|$$
$$H = \frac{P_6 + P_8}{2} + \alpha\frac{-G_5 + 2G_7 - G_9}{8}$$
$$V = \beta C_3 + \gamma G_7 + \delta D_B$$
$$P'_7 = \frac{h}{h+v}V + \frac{v}{h+v}H$$

where α, β, γ, and δ are constants, and h, v, H, and V are intermediate variables. The value of α in the preferred embodiment of this invention is zero. In an alternate embodiment of this invention, the value of α is one. It will be obvious to one skilled in the art that other values of α can also be used.

Changing the value of α has the effect of controlling how much the color pixel values are weighted in the process of determining the interpolated panchromatic value P'$_7$. The values of β, γ, and δ in the preferred embodiment of this invention are one-third. It will be obvious to one skilled in the art that other values of β, γ, and δ can also be used. Changing the values of β, γ, and δ has the effect of controlling how closely the interpolated panchromatic value V matches the color responses of the measured panchromatic values such as P$_6$ and P$_8$.

In FIG. 11B, C$_A$ is either a red or blue pixel and D$_1$, D$_8$, D$_C$, and D$_J$ are either blue or red pixels, respectively, from the color filter array image 100 (FIG. 6). G$_2$, G$_4$, G$_6$, G$_E$, G$_G$ and G$_I$ are green pixels and P$_3$, P$_5$, P$_7$, P$_9$, P$_B$, P$_F$ and P$_H$ are panchromatic pixels. In order to produce the interpolated panchromatic value P'$_A$ the following computations are performed.

$$h = |P_3 - P_5| + 2|P_9 - P_B| + |P_F - P_H|$$
$$v = |P_3 - P_9| + |P_9 - P_F| + |P_5 - P_B| + |P_B - P_H|$$
$$H = \frac{-P_7 + 9P_9 + 9P_B - P_D}{16}$$
$$V = \beta C_A + \gamma\frac{G_4 + G_G}{2} + \delta\frac{D_1 + D_J}{2}$$
$$P'_A = \frac{h}{h+v}V + \frac{v}{h+v}H$$

where β, γ, and δ are constants, and h, v, H, and V are intermediate variables. The values of β, γ, and δ in the preferred embodiment of this invention are one-third. It will be obvious to one skilled in the art that other values of β, γ, and δ can also be used. Changing the values of β, γ, and δ has the effect of controlling how closely the interpolated panchromatic value V matches the color responses of the measured panchromatic values such as P$_9$ and P$_B$.

Figure 12B:
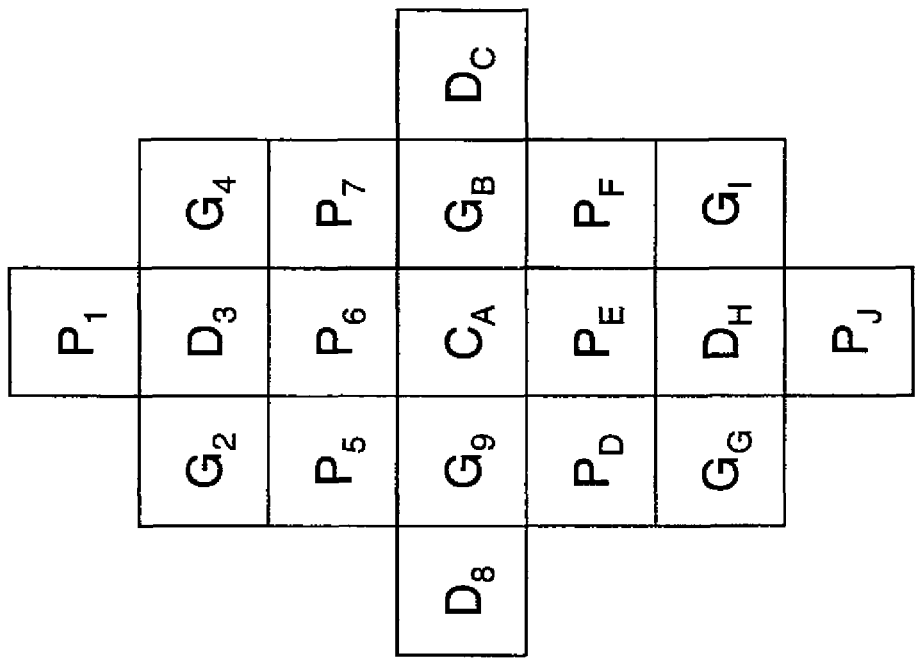
FIG. 12A and FIG. 12B are pixel neighborhoods used in interpolating panchromatic image values.
Figure 12A:
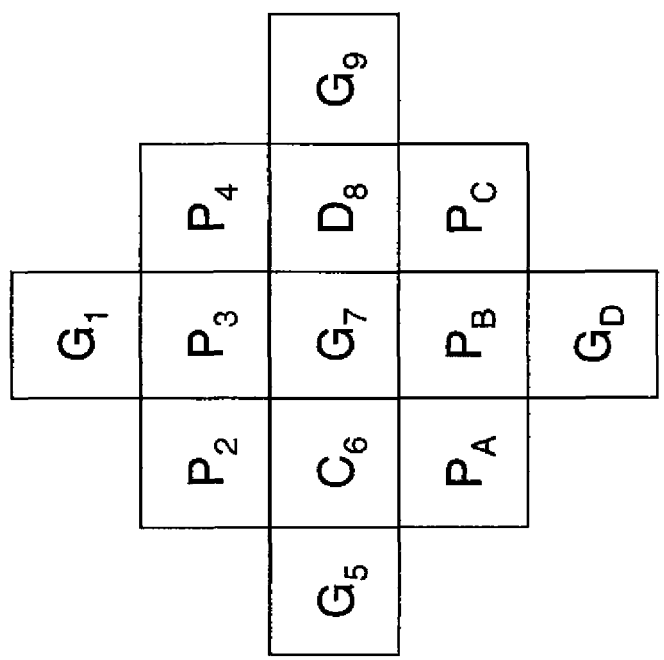

FIGS. 12A and 12B are detailed diagrams of pixel neighborhoods that can be used for an alternate embodiment of the interpolate panchromatic image block 102 (FIG. 6) for the CFA pattern shown in FIG. 5B. In FIG. 12A, C$_6$ is either a red or blue pixel and D$_8$ is either a blue or red pixel, respectively, from the color filter array image 100 (FIG. 6). G$_1$, G$_5$, G$_7$, G$_9$ and G$_D$ are green pixels and P$_2$, P$_3$, P$_4$, P$_A$, P$_B$ and P$_C$ are panchromatic pixels. In FIG. 12A, panchromatic pixels alternate with the green pixels in the vertical direction. In order to produce the interpolated panchromatic value P'$_7$ the following computations are performed.

$$h = |P_2 - P_3| + |P_3 - P_4| + |P_A - P_B| + |P_B - P_C|$$
$$v = 2|P_3 - P_B| + \alpha|G_1 - 2G_7 + G_D|$$
$$H = \beta C_6 + \gamma G_7 + \delta D_8$$
$$V = \frac{P_3 + P_B}{2} + \alpha\frac{-G_1 + 2G_7 - G_D}{8}$$
$$P'_7 = \frac{h}{h+v}V + \frac{v}{h+v}H$$

where α, β, γ, and δ are constants, and h, v, H, and V are intermediate variables. The value of α in the preferred embodiment of this invention is zero. In an alternate embodiment of this invention, the value of α is one. It will be obvious to one skilled in the art that other values of α can also be used. Changing the value of α has the effect of controlling how much the color pixel values are weighted in the process of determining the interpolated panchromatic value P'$_7$. The values of β, γ, and δ in the preferred embodiment of this invention are one-third. It will be obvious to one skilled in the art that other values of β, γ, and δ can also be used. Changing the values of β, γ, and δ has the effect of controlling how closely the interpolated panchromatic value H matches the color responses of the measured panchromatic values such as $P_3$ and $P_B$.

In FIG. 12B, $C_A$ is either a red or blue pixel and $D_3$, $D_8$, $D_C$, and $D_H$ are either blue or red pixels, respectively, from the color filter array image 100 (FIG. 6). $G_2$, $G_4$, $G_9$, $G_B$, $G_G$ and $G_I$ are green pixels and $P_1$, $P_5$, $P_6$, $P_7$, $P_D$, $P_E$, $P_F$ and $P_J$ are panchromatic pixels. In order to produce the interpolated panchromatic value $P'_A$ the following computations are performed.

$$h = |P_5 - P_6| + |P_6 - P_7| + |P_D - P_E| + |P_E - P_F|$$

$$v = |P_5 - P_D| + 2|P_6 - P_E| + |P_7 - P_F|$$

$$H = \beta C_A + \gamma \frac{G_9 + G_B}{2} + \delta \frac{D_8 + D_C}{2}$$

$$V = \frac{-P_1 + 9P_6 + 9P_E - P_J}{16}$$

$$P'_A = \frac{h}{h+v} V + \frac{v}{h+v} H$$

where β, γ, and δ are constants, and h, v, H, and V are intermediate variables. The values of β, γ, and δ in the preferred embodiment of this invention are one-third. It will be obvious to one skilled in the art that other values of β, γ, and δ can also be used. Changing the values of β, γ, and δ has the effect of controlling how closely the interpolated panchromatic value V matches the color responses of the measured panchromatic values such as $P_6$ and $P_E$.

FIG. 13 is a detailed diagram of a pixel neighborhood used in the interpolate color difference image block 112 (FIG. 6) to determine green color difference values for the preferred embodiment of the CFA pattern shown in FIG. 3. In FIG. 13, $D_1$, $D_3$, $D_7$, and $D_9$ are color difference values 110 (FIG. 6) produced by the generate color differences block 108 (FIG. 6) for the green pixels. The values of $D_1$, $D_3$, $D_7$, and $D_9$ are computed as given below.

$D_1 = G_1 - P'_1$ $D_3 = G_3 - P'_3$ $D_7 = G_7 - P'_7$ $D_9 = G_9 - P'_9$

In these computations, G refers to the original green pixel value from the color filter array image 100 (FIG. 6) and P' refers to the corresponding interpolated panchromatic value from the interpolated panchromatic image 104 (FIG. 6). The subscripts correspond to the pixel positions shown in FIG. 13.

The interpolate color difference image block 112 (FIG. 6) produces interpolated color difference values D' at the pixel locations in FIG. 13 without an existing color difference value D. Standard bilinear interpolation of the color difference values $D_1$, $D_3$, $D_7$, and $D_9$ produces the interpolated color difference values D'. The following equations show the explicit computations that can be used to determine the interpolated color difference values D':

$D'_2 = (D_1 + D_3)/2$ $D'_4 = (D_1 + D_7)/2$ $D'_5 = (D_1 + D_3 + D_7 + D_9)/4$ $D'_6 = (D_3 + D_9)/2$ $D'_8 = (D_7 + D_9)/2$

The interpolated color difference values combined with the color values ($D_1$, $D_3$, $D_7$, and $D_9$) make up the interpolated color difference image 114 (FIG. 6).

FIG. 14 is a detailed diagram of a pixel neighborhood used in the interpolate color difference image block 112 (FIG. 6) to determine red and blue color difference values for the preferred embodiment of the CFA pattern shown in FIG. 3. In FIG. 14, $D_0$, $D_4$, $D_K$, and $D_P$ are color difference values 110 (FIG. 6) produced by the generate color differences block 108 (FIG. 6) for the red and blue pixels. In the following discussion red pixels will be assumed, but it will be obvious that the same approach can be applied for the blue pixels. The values of $D_0$, $D_4$, $D_K$, and $D_P$ are computed as given below.

$D_0 = R_0 - P'_0$ $D_4 = R_4 - P'_4$ $D_K = R_K - P'_K$ $D_P = R_P - P'_P$

In these computations R refers to the original red pixel value from the color filter array image 100 (FIG. 6) and P' refers to the corresponding interpolated panchromatic value from the interpolated panchromatic image 104 (FIG. 6). The subscripts correspond to the pixel positions shown in FIG. 14. The interpolate color difference image block 112 (FIG. 6) produces interpolated color difference values D' at the pixel locations in FIG. 14 without an existing color difference value D. Standard bilinear interpolation of the color difference values $D_0$, $D_4$, $D_K$, and $D_P$ produces the interpolated color difference values D'. The following equations show the explicit computations that can be used to determine the interpolated color difference values D':

$D'_1 = (3D_0 + D_4)/4$ $D'_2 = (D_0 + D_4)/2$ $D'_3 = (D_0 + 3D_4)/4$ $D'_5 = (3D_0 + D_K)/4$ $D'_6 = (9D_0 + 3D_4 + 3D_K + D_P)/16$ $D'_7 = (3D_0 + 3D_4 + D_K + D_P)/8$ $D'_8 = (3D_0 + 9D_4 + D_K + 3D_P)/16$ $D'_9 = (3D_4 + D_P)/4$ $D'_A = (D_0 + D_K)/2$ $D'_B = (3D_0 + D_4 + 3D_K + D_P)/8$ $D'_C = (D_0 + D_4 + D_K + D_P)/4$ $D'_D = (D_0 + 3D_4 + D_K + 3D_P)/8$ $D'_E = (D_4 + D_P)/2$ $D'_F = (D_0 + 3D_K)/4$ $D'_G = (3D_0 + D_4 + 9D_K + 3D_P)/16$ $D'_H = (D_0 + D_4 + 3D_K + 3D_P)/8$ $D'_J=(D_0+3D_4+3D_K+9D_P)/16$ $D'_J=(D_4+3D_P)/4$ $D'_L=(3D_K+D_P)/4$ $D'_M=(D_K+D_P)/2$ $D'_N=(D_K+3D_P)/4$

The interpolated color difference values combined with the color values ($D_1$, $D_3$, $D_7$, and $D_9$) make up the interpolated color difference image 114 (FIG. 6).

The generate interpolated color image block 106 (FIG. 5) produces interpolated color values R', G', and B' from the interpolated color difference values D' and the corresponding panchromatic value, either original or interpolated. Again referring to FIG. 13, the following computations are performed.

$G'_2=D'_2+P_2$ $G'_4=D'_4+P_4$ $G'_5=D'_5+P'_5$ $G'_6=D'_6+P_6$ $G'_8=D'_8+P_8$

The original color values G together with the interpolated color values G' produce the green values of the interpolated color image 120 (FIG. 6). The preceding set of operations can be generalized for the red and blue pixel values with respect to FIG. 14 to complete the production of the interpolated color image 120 (FIG. 6).

A similar strategy can be used to determine the interpolated color image 120 for other CFA pattern variations according to the method of the present invention, such as those shown in FIG. 4A, 4B, 5A, 5B or 25. For a given color, the first step is to calculate color difference values at the pixel positions where that color occurs in the CFA pattern. Next an interpolation step is used to determine color difference values for the remainder of the pixels by interpolating between the color difference values found in the first step. This is repeated for each of the colors (i.e., red, green and blue). Finally, interpolated color values are found by adding the color difference values to the interpolated panchromatic image.

FIGS. 15A and 15B are detailed diagrams of a pixel neighborhood used in the interpolate color difference image block 112 (FIG. 6) for the CFA pattern shown in the alternate embodiment of FIGS. 4A and 4B. FIG. 15A corresponds to FIG. 4A and FIG. 15B corresponds to FIG. 4B. In FIG. 15A, $D_0$, $D_4$, $D_A$, and $D_E$ are color difference values 110 (FIG. 6) produced by the generate color differences block 108 (FIG. 6). The locations of $D_0$, $D_4$, $D_A$, and $D_E$ correspond to all red pixels, all green pixels, or all blue pixels in the color filter array image 100 (FIG. 6). The following example will assume red pixels; however, the process can similarly be applied to the green and blue pixels. The values of $D_0$, $D_4$, $D_A$, and $D_E$ are computed as follows:

$D_0=R_0-P'_0$ $D_4=R_4-P'_4$ $D_A=R_A-P'_A$ $D_E=R_E-P'_E$

In these computations R refers to the original red pixel value from the color filter array image 100 (FIG. 6) and P' refers to the corresponding interpolated panchromatic value from the interpolated panchromatic image 104 (FIG. 6).

Returning to FIG. 15A, the interpolate color difference image block 112 (FIG. 6) produces interpolated color difference values D' at the pixel locations without an existing color difference value D. Standard bilinear interpolation of the color difference values $D_0$, $D_4$, $D_A$, and $D_E$ produces the interpolated color difference values D' according to the following explicit computations:

$D'_1=(3D_0+D_4)/4$ $D'_2=(D_0+D_4)/2$ $D'_3=(D_0+3D_4)/4$ $D'_5=(D_0+D_A)/2$ $D'_6=(3D_0+D_4+3D_A+D_E)/8$ $D'_7=(D_0+D_4+D_A+D_E)/4$ $D'_8=(D_0+3D_4+D_A+3D_E)/8$ $D'_9=(D_4+D_E)/2$ $D'_B=(3D_A+D_E)/4$ $D'_C=(D_A+D_E)/2$ $D'_D=(D_A+3D_E)/4$

The interpolated color difference values together with the color values ($D_0$, $D_4$, $D_A$, and $D_E$) make up the interpolated color difference image 114 (FIG. 6).

The generate interpolated color image block 106 (FIG. 6) produces interpolated color values R' from the interpolated color difference values D' and the corresponding panchromatic value, either original or interpolated. Again referring to FIG. 15A, the following computations are performed:

$R'_1=D'_1+P_1$ $R'_2=D'_2+P'_2$ $R'_3=D'_3+P_3$ $R'_5=D'_5+P_5$ $R'_6=D'_6+P'_6$ $R'_7=D'_7+P_7$ $R'_8=D'_8+P'_8$ $R'_9=D'_9+P_9$ $R'_B=D'_B+P_B$ $R'_C=D'_C+P'_C$ $R'_D=D'_D+P_D$

The original color values R and the interpolated color values R' make up the red values of the interpolated color image 120 (FIG. 6). The preceding process is repeated for the green and blue pixels.

Similarly, in FIG. 15B, $D_0$, $D_2$, $D_C$, and $D_E$ are color difference values 110 (FIG. 6) produced by the generate color differences block 108 (FIG. 6). The locations of $D_0$, $D_2$, $D_C$, and $D_E$ correspond to all red pixels, all green pixels, or all blue pixels in the color filter array image 100 (FIG. 6). The following example will assume red pixels; however, the process can similarly be applied to the green and blue pixels. The values of $D_0$, $D_2$, $D_C$, and $D_E$ are computed as follows:

$$D_0 = R_0 - P'_0$$

$$D_2 = R_2 - P'_2$$

$$D_C = R_C - P'_C$$

$$D_E = R_E - P'_E$$

In these computations R refers to the original red pixel value from the color filter array image 100 (FIG. 6) and P' refers to the corresponding interpolated panchromatic value from the interpolated panchromatic image 104 (FIG. 6).

Returning to FIG. 15B, the interpolate color difference image block 112 (FIG. 6) produces interpolated color difference values D' at the pixel locations without an existing color difference value D. Standard bilinear interpolation of the color difference values $D_0$, $D_2$, $D_C$, and $D_E$ produces the interpolated color difference values D' according to the following explicit computations:

$$D'_1 = (D_0 + D_2)/2$$

$$D'_3 = (3D_0 + D_C)/4$$

$$D'_4 = (3D_0 + 3D_2 + D_C + D_E)/8$$

$$D'_5 = (3D_2 + D_E)/2$$

$$D'_6 = (D_0 + D_C)/2$$

$$D'_7 = (D_0 + D_2 + D_C + D_E)/4$$

$$D'_8 = (D_2 + D_E)/2$$

$$D'_9 = (D_0 + 3D_C)/4$$

$$D'_A = (D_0 + D_2 + 3D_C + 3D_E)/8$$

$$D'_B = (D_2 + 3D_E)/2$$

$$D'_D = (D_C + D_E)/2$$

The interpolated color difference values together with the color values ($D_0$, $D_2$, $D_C$, and $D_E$) make up the interpolated color difference image 114 (FIG. 6).

The generate interpolated color image block 106 (FIG. 6) produces interpolated color values R' from the interpolated color difference values D' and the corresponding panchromatic value, either original or interpolated. Again referring to FIG. 15B, the following computations are performed:

$$R'_1 = D'_1 + P'_1$$

$$R'_3 = D'_3 + P'_3$$

$$R'_4 = D'_4 + P_4$$

$$R'_5 = D'_5 + P_5$$

$$R'_6 = D'_6 + P'_6$$

$$R'_7 = D'_7 + P_7$$

$$R'_8 = D'_8 + P'_8$$

$$R'_9 = D'_9 + P_9$$

$$R'_A = D'_A + P_A$$

$$R'_B = D'_B + P'_B$$

$$R'_D = D'_D + P_D$$

The original color values R and the interpolated color values R' make up the red values of the interpolated color image 120 (FIG. 6). The preceding process is repeated for the green and blue pixels.

FIGS. 16A and 16B are detailed diagrams of pixel neighborhoods that can be used to interpolate the color difference values in the interpolate color difference image block 112 (FIG. 6) for the alternate CFA pattern embodiment of FIGS. 5A and 5B. FIG. 16A corresponds to FIG. 5A and FIG. 16B corresponds to FIG. 5B. In FIG. 16A, $D_0$, $D_4$, $D_8$, and $D_C$ are color difference values 110 (FIG. 6) produced by the generate color differences block 108 (FIG. 6). The locations of $D_0$, $D_4$, $D_8$, and $D_C$ correspond to all red pixels, all green pixels, or all blue pixels in the color filter array image 100 (FIG. 6). The following example will assume red pixels; however, the process can similarly be applied to the green and blue pixels. The values of $D_0$, $D_4$, $D_8$, and $D_C$ are computed as follows:

$$D_0 = R_0 - P'_0$$

$$D_4 = R_4 - P'_4$$

$$D_8 = R_8 - P'_8$$

$$D_C = R_C - P'_C$$

In these computations R refers to the original red pixel value from the color filter array image 100 (FIG. 6) and P' refers to the corresponding interpolated panchromatic value from the interpolated panchromatic image 104 (FIG. 6).

Returning to FIG. 16A, the interpolate color difference image block 112 (FIG. 6) produces interpolated color difference values D' at the pixel locations without an existing color difference value D. Standard bilinear interpolation of the color difference values $D_0$, $D_4$, $D_8$, and $D_C$ produces the interpolated color difference values D'. The explicit computations are as follows:

$$D'_1 = (D_0 + D_4)/2$$

$$D'_2 = (9D_0 + 3D_4 + 3D_8 + D_C)/16$$

$$D'_3 = (D_0 + D_8)/2$$

$$D'_5 = (3D_0 + 9D_4 + D_8 + 3D_C)/16$$

$$D'_6 = (D_0 + D_4 + D_8 + D_C)/4$$

$$D'_7 = (3D_0 + D_4 + 9D_8 + 3D_C)/16$$

$$D'_9 = (D_4 + D_C)/2$$

$$D'_A = (D_0 + 3D_4 + 3D_8 + 9D_C)/16$$

$$D'_B = (D_8 + D_C)/2$$

The interpolated color difference values together with the color values ($D_0$, $D_4$, $D_8$, and $D_C$) make up the interpolated color difference image 114 (FIG. 6).

The generate interpolated color image block 106 (FIG. 6) produces interpolated color values R' from the interpolated color difference values D' and the corresponding panchromatic value, either original or interpolated. Again referring to FIG. 16A, the following computations are performed:

$$R'_1 = D'_1 + P_1$$

$$R'_2 = D'_2 + P'_2$$

$$R'_3 = D'_3 + P_3$$

$R'_5 = D'_5 + P_5$ $R'_6 = D'_6 + P'_6$ $R'_7 = D'_7 + P_7$ $R'_9 = D'_9 + P_9$ $R'_A = D'_A + P'_A$ $R'_B = D'_B + P_B$

The original color values R together with the interpolated color values R' make up the red values of the interpolated color image 120 (FIG. 6). The preceding set of operations is repeated for the green and blue pixel values to complete the production of the interpolated color image 120 (FIG. 6).

In FIG. 16B, $D_0$, $D_4$, $D_8$, and $D_C$ are color difference values 110 (FIG. 6) produced by the generate color differences block 108 (FIG. 6). The locations of $D_0$, $D_4$, $D_8$, and $D_C$ correspond to all red pixels, all green pixels, or all blue pixels in the color filter array image 100 (FIG. 6). The following example will assume red pixels; however, the process can similarly be applied to the green and blue pixels. The values of $D_0$, $D_4$, $D_8$, and $D_C$ are computed as follows:

$D_0 = R_0 - P'_0$ $D_4 = R_4 - P'_4$ $D_8 = R_8 - P'_8$ $D_C = R_C - P'_C$

In these computations R refers to the original red pixel value from the color filter array image 100 (FIG. 6) and P' refers to the corresponding interpolated panchromatic value from the interpolated panchromatic image 104 (FIG. 6).

Returning to FIG. 16B, the interpolate color difference image block 112 (FIG. 6) produces interpolated color difference values D' at the pixel locations without an existing color difference value D. Standard bilinear interpolation of the color difference values $D_0$, $D_4$, $D_8$, and $D_C$ produces the interpolated color difference values D'. The explicit computations are as follows:

$D'_1 = (D_0 + D_4)/2$ $D'_2 = (9D_0 + 3D_4 + 3D_8 + D_C)/16$ $D'_3 = (D_0 + D_8)/2$ $D'_5 = (3D_0 + 9D_4 + D_8 + 3D_C)/16$ $D'_6 = (D_0 + D_4 + D_8 + D_C)/4$ $D'_7 = (3D_0 + D_4 + 9D_8 + 3D_C)/16$ $D'_9 = (D_4 + D_C)/2$ $D'_A = (D_0 + 3D_4 + 3D_8 + 9D_C)/16$ $D'_B = (D_8 + D_C)/2$

The interpolated color difference values together with the color values ($D_0$, $D_4$, $D_8$, and $D_C$) make up the interpolated color difference image 114 (FIG. 6).

The generate interpolated color image block 106 (FIG. 6) produces interpolated color values R' from the interpolated color difference values D' and the corresponding panchromatic value, either original or interpolated. Again referring to FIG. 16B, the following computations are performed:

$R'_1 = D'_1 + P_1$ $R'_2 = D'_2 + P_2$ $R'_3 = D'_3 + P_3$ $R'_5 = D'_5 + P'_5$ $R'_6 = D'_6 + P'_6$ $R'_7 = D'_7 + P'_7$ $R'_9 = D'_9 + P_9$ $R'_A = D'_A + P_A$ $R'_B = D'_B + P_B$

The original color values R together with the interpolated color values R' make up the red values of the interpolated color image 120 (FIG. 6). The preceding set of operations is repeated for the green and blue pixel values to complete the production of the interpolated color image 120 (FIG. 6).

Figure 17:
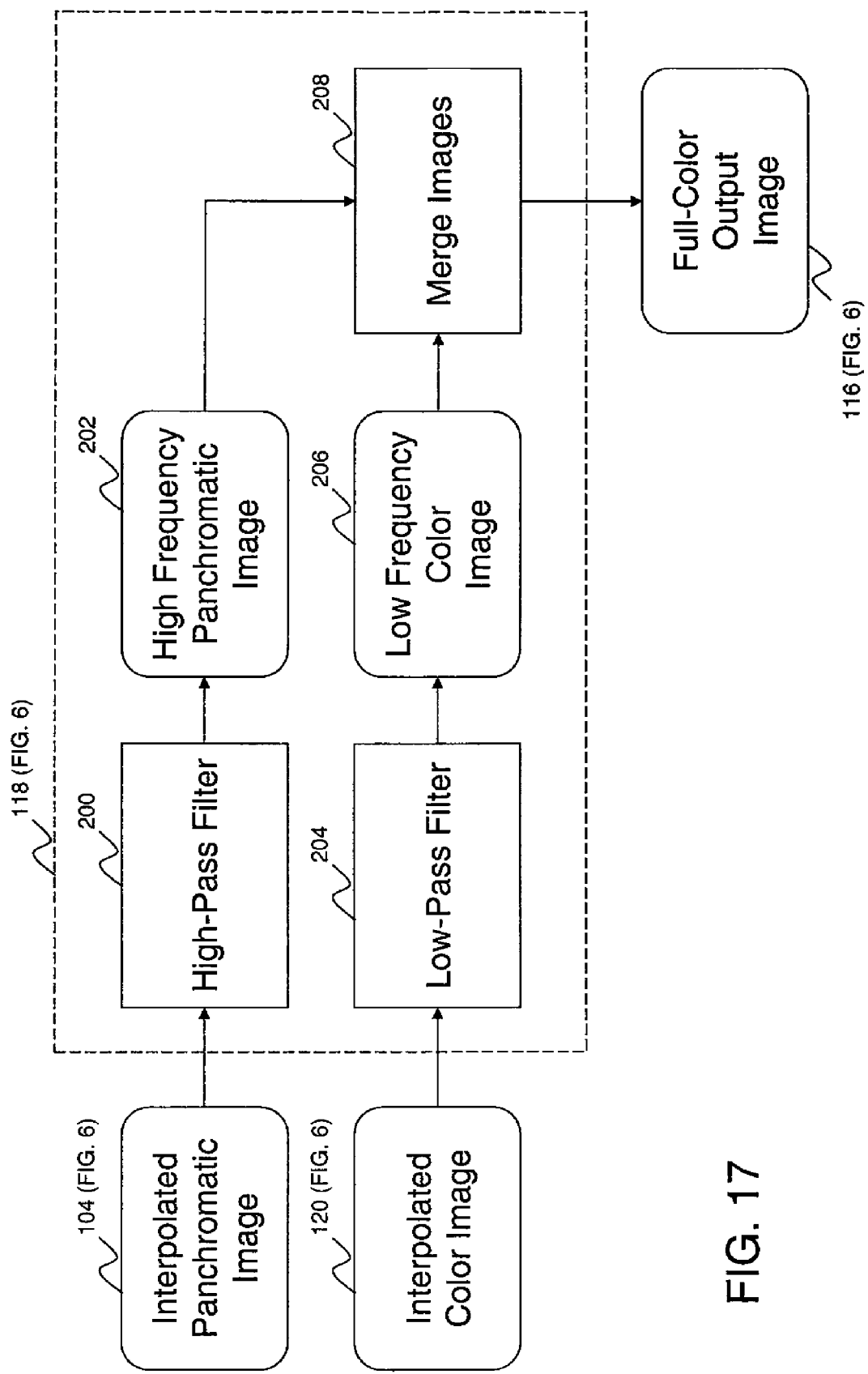
FIG. 17 is a block diagram showing a detailed view of the fuse images block for a preferred embodiment of the present invention.

FIG. 17 is a block diagram of a preferred embodiment of the fuse images block 118 (FIG. 6). A low-pass filter block 204 produces a low frequency color image 206 from the interpolated color image 120 (FIG. 6). A high-pass filter block 200 produces a high frequency panchromatic image 202 from the interpolated panchromatic image 104 (FIG. 6). Finally, a merge images block 208 produces the full-color output image 116 (FIG. 6) by combining the low frequency color image 206 and the high frequency panchromatic image 202.

The low-pass filter block 204 performs a convolution of the interpolated color image 120 (FIG. 6) using a low-pass filter. In a preferred embodiment of the present invention, the following convolution kernel is used:

$$g = \frac{1}{16}\begin{pmatrix} 1 & 2 & 1 \\ 2 & 4 & 2 \\ 1 & 2 & 1 \end{pmatrix}$$

Mathematically, $C_L = C * g$, where C is the interpolated color image 120 (FIG. 6), $C_L$ is the low frequency color image 206 and "*" represents the convolution operator. It will be clear to one skilled in the art that other convolution kernels can be used in accordance with the present invention.

The high-pass filter block 200 performs a convolution of the interpolated panchromatic image 104 (FIG. 6) using a high-pass filter. In a preferred embodiment of the present invention, the following convolution kernel is used:

$$h = \frac{1}{16}\begin{pmatrix} -1 & -2 & -1 \\ -2 & 12 & -2 \\ -1 & -2 & -1 \end{pmatrix}$$

Mathematically, $P_H = P * h$, where P is the interpolated panchromatic image 104 (FIG. 6) and $P_H$ is the high frequency panchromatic image 202. It will be clear to one skilled in the art that other convolution kernels can be used in accordance with the present invention.

The merge images block 208 combines the high frequency panchromatic image 202 and the low frequency color image 206 together to produce the full-color output image 116 (FIG. 6). In a preferred embodiment of the present invention, this is accomplished by simply adding the high frequency panchromatic image 202 and the low frequency color image 206. Mathematically, $C'=C_L+P_H$, where C' is the full-color output image 116 (FIG. 6) and the other terms are as previously defined.

Figure 18:
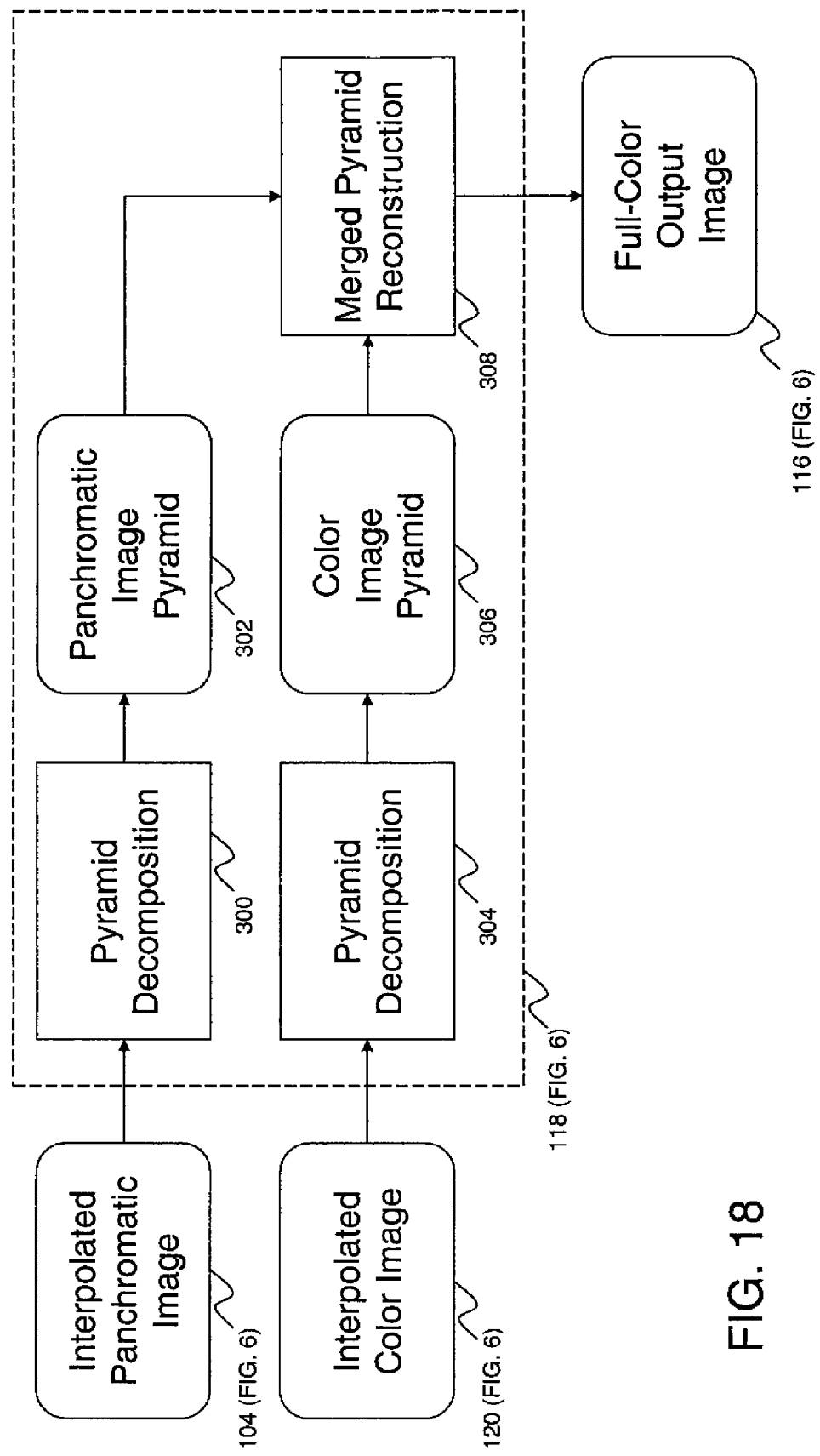
FIG. 18 is a block diagram showing a detailed view of the fuse images block for an alternate embodiment of the present invention.
Figures 21A, 21B, 21C:
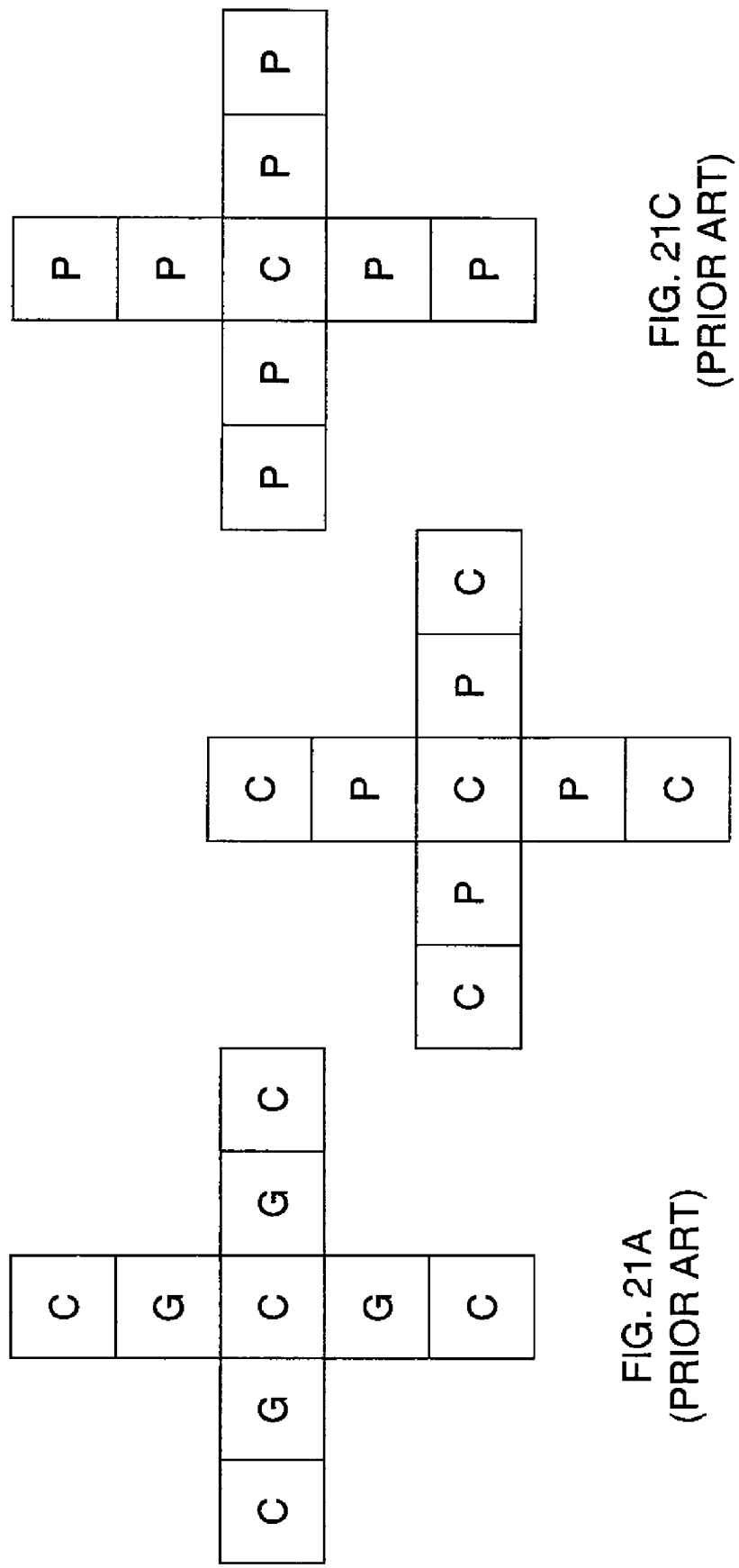
FIG. 21A, FIG. 21B and FIG. 21C are pixel neighborhoods used for interpolating green and panchromatic image values from the prior art.

FIG. 18 is a block diagram of an alternate embodiment of the fuse images block 118 (FIG. 6). A pyramid decomposition block 300 produces a panchromatic image pyramid 302 from the interpolated panchromatic image 104 (FIG. 6). A pyramid decomposition block 304 produces a color image pyramid 306 from the interpolated color image 120 (FIG. 6). A merged pyramid reconstruction block 308 produces the full-color output image 116 (FIG. 6) by combining the panchromatic image pyramid 302 and the color image pyramid 306. The pyramid decomposition block 300 produces a standard Gaussian-Laplacian image pyramid by a method that will be known to one skilled in the art. Briefly, the following computations are performed.

$$P_1 = (P_0 * g) \downarrow 2 \quad Q_1 = P_0 - (P_1 \uparrow 2)$$
$$P_2 = (P_1 * g) \downarrow 2 \quad Q_2 = P_1 - (P_2 \uparrow 2)$$
$$\vdots \quad \vdots$$
$$P_N = (P_{N-1} * g) \downarrow 2 \quad Q_N = P_{N-1} - (P_N \uparrow 2)$$

$P_0$ is the interpolated panchromatic image 104 (FIG. 6). $P_0$ is convolved with the low-pass filter convolution kernel g, which has been described previously. The result of the convolution operation is subsampled by a factor of 2 both horizontally and vertically ($\downarrow 2$). The result of the subsampling is $P_1$, the first level component of the corresponding Gaussian pyramid of the panchromatic image pyramid 302. This process in continued to produce $P_2$ through $P_N$ where N is the desired number of pyramid levels. In one embodiment of the present invention N=4.

$Q_1$ is the first level component of the corresponding Laplacian pyramid of the panchromatic image pyramid 302. It is computed by taking the first level component of the Gaussian pyramid, $P_1$, and upsampling it by a factor of 2 both horizontally and vertically ($\uparrow 2$) and then subtracting the result from the interpolated panchromatic image 104 (FIG. 6). The upsampling operation can be performed in any manner known to those skilled in the art. In one embodiment of the present invention, the upsampling is performed using well-known bilinear interpolation. This process is continued to produce $Q_2$ through $Q_N$. The pyramid components $\{P_1, \ldots, P_N, Q_1, \ldots, Q_N\}$ taken together make up the pyramid image pyramid 302.

Pyramid decomposition block 304 is performed in the same manner as the pyramid decomposition block 300 except that each color of the interpolated color image 120 (FIG. 6) is processed separately to produce red, green, and blue pyramids that, taken together, make up the color image pyramid 306. To establish notation, the computations performed by the pyramid decomposition block 304 are as follows:

$$C_1 = (C_0 * g) \downarrow 2 \quad H_1 = C_0 - (C_1 \uparrow 2)$$
$$C_2 = (C_1 * g) \downarrow 2 \quad H_2 = C_1 - (C_2 \uparrow 2)$$
$$\vdots \quad \vdots$$
$$C_N = (C_{N-1} * g) \downarrow 2 \quad H_N = C_{N-1} - (C_N \uparrow 2)$$

Pyramid components $\{C_1, \ldots, C_N\}$ together make up the color Gaussian pyramid and pyramid components $\{H_1, \ldots, H_N\}$ together make up the color Laplacian pyramid.

The merged pyramid reconstruction block 308 performs the following computations which are a modification of the standard Gaussian-Laplacian pyramid reconstruction that will be known to those skilled in the art:

$$\begin{cases} C'_{N-1} = (C_N \uparrow 2) + H_N \\ P'_{N-1} = (P_N \uparrow 2) + Q_N \\ C''_{N-1} = P'_{N-1} * h + C'_{N-1} * g \end{cases}$$
$$\begin{cases} C'_{N-2} = (C''_{N-1} \uparrow 2) + H_{N-1} \\ P'_{N-2} = (P'_{N-1} \uparrow 2) + Q_{N-1} \\ C''_{N-2} = P'_{N-2} * h + C'_{N-2} * g \end{cases}$$
$$\vdots$$
$$\begin{cases} C'_0 = (C''_1 \uparrow 2) + H_1 \\ P'_0 = (P'_1 \uparrow 2) + Q_1 \\ C''_0 = P'_0 * h + C'_0 * g \end{cases}$$

In each set of three computations, a Gaussian color pyramid component, C, or a merged Gaussian color pyramid component, C", is upsampled by a factor of 2 and added to a Laplacian color pyramid component, H. Then a Gaussian panchromatic pyramid component, P or P', is upsampled by 2 and added to a Laplacian panchromatic pyramid component, Q. The resulting Gaussian color pyramid component, C', is convolved with the previously described low pass convolution kernel g, the resulting Gaussian panchromatic pyramid component, P', is convolved with the previously described high pass convolution kernel h, and the results added together to produce the merged Gaussian color pyramid component C". These computations are repeated until the full-color output image 116 (FIG. 6), C"$_0$, is produced.

The algorithm for computing the full-color output image as disclosed in the preferred embodiment of the present invention can be employed in a variety of user contexts and environments. Exemplary contexts and environments include, without limitation, in-camera processing (reading sensor image, digital processing, saving processed image on digital media), wholesale digital photofinishing (which involves exemplary process steps or stages such as submitting digital images for wholesale fulfillment, digital processing, and digital printing), retail digital photofinishing (submitting digital images for retail fulfillment, digital processing, and digital printing), home printing (inputting home digital images, digital processing, and printing on a home printer), desktop software (software that applies algorithms to digital images to make them better—or even just to change them), digital fulfillment (inputting digital images—from media or over the web, digital processing, outputting digital images—on media, digital form over the internet), kiosks (inputting digital images, digital processing, digital printing or outputting digital media), mobile devices (e.g., PDA or cell phone that can be used as a processing unit, a display unit, or a unit to give processing instructions), and as a service offered via the World Wide Web.

In each case, the algorithm for computing the full-color output image can stand alone or can be a component of a larger system solution. Furthermore, the interfaces with the algorithm (e.g., the input, the digital processing, the display to a user (if needed), the input of user requests or processing instructions (if needed), and the output) can each be on the same or different devices and physical locations, and communication between the devices and locations can be via public or private network connections, or media based communication. Where consistent with the foregoing disclosure of the present invention, the algorithms themselves can be fully automatic, can have user input (i.e., they can be fully or partially manual), can have user or operator review to accept/reject the result, or can be assisted by metadata (metadata can be user supplied, supplied by a measuring device (e.g. in a camera) or determined by an algorithm). Moreover, the algorithms can interface with a variety of workflow user interface schemes.

The computation of the full-color output image algorithm disclosed herein in accordance with the invention can have interior components that utilize various data detection and reduction techniques (e.g., face detection, eye detection, skin detection, flash detection).

The invention has been described in detail with particular reference to certain preferred embodiments thereof, but it will be understood that variations and modifications can be effected within the spirit and scope of the invention.

PARTS LIST 10 light from subject scene
11 imaging stage
12 lens
13 neutral density (ND) filter block
14 iris block
16 brightness sensor block
18 shutter
20 color filter array image sensor
22 analog signal processor
24 analog-to-digital (A/D) converter
26 timing generator
28 image sensor stage
30 bus
32 digital signal processor (DSP) memory
36 digital signal processor (DSP)
38 processing stage
40 exposure controller
50 system controller
52 system controller bus
54 program memory
56 system memory
57 host interface
60 memory card interface
62 memory card socket
64 memory card
68 user interface
70 viewfinder display
72 exposure display
74 user inputs
76 status display
80 video encoder
82 display controller
88 image display
100 color filter array image
102 interpolate panchromatic image block
104 interpolated panchromatic image
106 generate interpolated color image block
108 generate color differences block
110 color difference values
112 interpolate color difference image block
114 interpolated color difference image
116 full-color output image
118 fuse images block
120 interpolated color image
200 high-pass filter block
202 high frequency panchromatic image
204 low-pass filter block
206 low frequency color image
208 merge images block
300 pyramid decomposition block
302 panchromatic image pyramid
304 pyramid decomposition block
306 color image pyramid
308 merged pyramid reconstruction block

What is claimed is:

1. An image sensor for capturing a color image comprising:
a two dimensional array of light-sensitive pixels including panchromatic pixels and color pixels having at least three different color responses, the color pixels being red, green and blue pixels,
the pixels being arranged in a rectangular minimal repeating unit having at least eight pixels, wherein the minimal repeating unit has four rows and four columns, and wherein the first and third rows of the minimal repeating unit have two green pixels and two panchromatic pixels, the second row of the minimal repeating unit has three panchromatic pixels and one red pixel, and the fourth row of the minimal repeating unit has three panchromatic pixels and one blue pixel,
wherein for a first color response, the color pixels having the first color response alternate with panchromatic pixels in at least two directions, and for each of the other color responses there is at least one row, column or diagonal of the repeating pattern that only has color pixels of the given color response and panchromatic pixels.

2. An image sensor for capturing a color image comprising:
a two dimensional array of light-sensitive pixels including panchromatic pixels and color pixels having at least three different color responses, the color pixels being red, green and blue pixels,
the pixels being arranged in a rectangular minimal repeating unit having at least eight pixels, wherein the minimal repeating unit has four rows and four columns, and wherein the first and third rows of the minimal repeating unit have a pixel sequence of green, panchromatic, green, panchromatic, the second row of the minimal repeating unit has a pixel sequence of panchromatic, red, panchromatic, panchromatic, and the fourth row of the minimal repeating unit has a pixel sequence of panchromatic, panchromatic, panchromatic, blue,
wherein for a first color response, the color pixels having the first color response alternate with panchromatic pixels in at least two directions, and for each of the other color responses there is at least one row, column or diagonal of the repeating pattern that only has color pixels of the given color response and panchromatic pixels.

3. The image sensor of claim 1 wherein the color pixels for each color response alternate with the panchromatic pixels for at least one row, column or diagonal of the repeating pattern.

4. The image sensor of claim 1 wherein the minimal repeating unit has at least twice as many pixels having a first color response than pixels having a second color response.

5. The image sensor of claim 4 wherein the first color response is green and the second color response is red or blue.

6. The image sensor of claim 1 wherein the panchromatic pixels are arranged in a checkerboard pattern.

7. The image sensor of claim 1 wherein the panchromatic pixels are arranged in alternating rows or columns.

8. An image sensor for capturing a color image comprising:
a two dimensional array of light-sensitive pixels including panchromatic pixels and color pixels having at least three different color responses, the color pixels being red, green and blue pixels,
the pixels being arranged in a rectangular minimal repeating unit having at least eight pixels, wherein the minimal repeating unit has four rows and four columns, and wherein the first and third columns of the minimal repeating unit have two green pixels and two panchromatic pixels, the second column of the minimal repeating unit has three panchromatic pixels and one red pixel, and the fourth column of the minimal repeating unit has three panchromatic pixels and one blue pixel,
wherein for a first color response, the color pixels having the first color response alternate with panchromatic pixels in at least two directions and for each of the other color responses there is at least one row, column or diagonal of the repeating pattern that only has color pixels of the given color response and panchromatic pixels.

* * * * *